(12) United States Patent
Shibuya et al.

(10) Patent No.: US 6,730,415 B2
(45) Date of Patent: May 4, 2004

(54) SOFT METAL AND METHOD OF MANUFACTURING THE SOFT METAL, AND DECORATIVE PART AND METHOD OF MANUFACTURING THE DECORATIVE PART

(75) Inventors: Yoshitsugu Shibuya, Toda (JP); Eigou Hashimoto, Sakado (JP); Junji Satoh, Kawagoe (JP); Masahiro Satoh, Iruma (JP); Seiichi Hiroe, Sayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 10/110,217

(22) PCT Filed: Aug. 20, 2001

(86) PCT No.: PCT/JP01/07115

§ 371 (c)(1),
(2), (4) Date: Apr. 19, 2002

(87) PCT Pub. No.: WO02/16663

PCT Pub. Date: Feb. 28, 2002

(65) Prior Publication Data

US 2003/0008168 A1 Jan. 9, 2003

(30) Foreign Application Priority Data

Aug. 21, 2000 (JP) ......................... 2000-249259
Nov. 8, 2000 (JP) ......................... 2000-340051

(51) Int. Cl.⁷ ..................... C23C 14/14; C23C 14/58; B32B 15/01
(52) U.S. Cl. ................. 428/670; 428/672; 428/615; 428/938; 204/192.16
(58) Field of Search ................ 428/615, 672, 428/673, 670, 938, 668, 680; 204/192.16, 298.13

(56) References Cited

U.S. PATENT DOCUMENTS

| | | | |
|---|---|---|---|
| 4,218,291 A | | 8/1980 | Fukuyama et al. |
| 4,555,186 A | * | 11/1985 | Scruggs .................. 384/93 |
| 4,578,728 A | * | 3/1986 | Sakakima et al. ........ 360/125 |
| 4,645,715 A | * | 2/1987 | Ovshinsky et al. ....... 428/469 |
| 5,147,732 A | * | 9/1992 | Shiroishi et al. .......... 428/668 |
| 5,376,191 A | * | 12/1994 | Roman et al. ............ 148/403 |
| 5,407,548 A | * | 4/1995 | Kopacz et al. ........ 204/192.15 |
| 5,549,797 A | * | 8/1996 | Hashimoto et al. .... 204/192.16 |

FOREIGN PATENT DOCUMENTS

| | | |
|---|---|---|
| EP | 0 724 022 A1 | 7/1996 |
| JP | 62-130897 | 6/1987 |
| JP | 63-216961 * | 9/1988 |
| JP | 02-279347 * | 11/1990 |
| JP | 6-272019 | 9/1994 |
| JP | 07-197250 * | 8/1995 |
| JP | 8-219174 | 8/1996 |
| JP | 10-151888 | 6/1998 |
| JP | 11-186035 | 7/1999 |
| JP | 2000-73148 | 3/2000 |
| JP | 2001-207255 * | 7/2001 |
| JP | 2001-208866 | 8/2001 |
| JP | 2001-262318 | 9/2001 |

* cited by examiner

Primary Examiner—John J. Zimmerman
(74) Attorney, Agent, or Firm—Westerman, Hattori, Daniels & Adrian, LLP

(57) ABSTRACT

A film is formed on the surface of a soft metal portion (2) such that the film contains phosphorus and either platinum or palladium, and further, at least one element having homogeneous solubility with platinum or palladium, with the content of the phosphorus being in a range of about 15 to 25 atomic %, or contains boron and iron with the content of the boron being in a range of from about 15 to 25 atomic %. Thus, a soft metal is made up by turning the film into a hard layer (3) made of an amorphous alloy.

16 Claims, 7 Drawing Sheets

SOFT METAL AND METHOD OF MANUFACTURING THE SOFT METAL, AND DECORATIVE PART AND METHOD OF MANUFACTURING THE DECORATIVE PART

TECHNICAL FIELD

The present invention relates to a soft metal that is resistant to corrosion and is excellent in durability, such as stainless steel, iron base alloy, titanium, titanium alloy, aluminum, aluminum alloy, brass, copper, copper alloy, magnesium, and magnesium alloy, a method of producing the same, a decorative article using the same, and a method of producing the decorative article.

BACKGROUND TECHNOLOGY

Since soft metals including stainless steel, iron base alloy, titanium, titanium alloy, aluminum, aluminum alloy, brass, copper, copper alloy, magnesium, and magnesium alloy are light in weight and inexpensive, these metals are worked into a wide variety of components for use in various fields. Examples of a soft metal article formed by processing the soft metals include decorative articles of wristwatch, such as a wristwatch case, wristwatch bezel, wristwatch case back, wristwatch band, clasp, crown, and so forth, and articles (hereinafter referred to as "decorative articles") which are required to have decorativeness in external appearance, including a pendant, pierced earring, earring, ring, the frame of eyeglasses, tie-pin, cuff links, and so forth.

Meanwhile, the soft metals are inferior in terms of impact resistance because the surface hardness thereof is as low as not more than Hv=200 of Vickers hardness, thereby rendering the surface thereof susceptible to scratches. Further, the soft metals such as iron base alloy, aluminum, aluminum alloy, brass, copper, copper alloy, magnesium, magnesium alloy and so forth, except stainless steel, titanium, and titanium alloy, have a property susceptible to corrosion because of their poor corrosion resistance. Accordingly, with the aim of improving the impact resistance and corrosion resistance of the soft metals used as the constituent material of soft metal articles, attempts have so far been made to apply various surface hardening treatments for hardening the surface of the soft metal articles to the surface thereof. In the case of conventional decorative articles of wristwatch, a surface hardening treatment to coat the surface thereof with a film having high hardness and high corrosion resistance has been applied thereto. For example, a wristwatch case and wristwatch band are produced by coating the surface of brass as a base with a nickel electroplating film several tens of μm thick, serving as an intermediate layer, and further, by coating the surface of the nickel electroplating film with a titanium nitride film several thousands angstroms (Å) thick. The wristwatch case and wristwatch band as described have hardness at not less than Hv=1000 of Vickers hardness, exhibiting such high hardness and high corrosion resistance as showing no initiation of rust even when subjected to a salt spray test (SST) in accordance with JIS2371.

As methods of hardening the surface of the soft metal, there are generally available a method of forming a film coating the surface thereof, and a method of hardening the soft metal itself.

Examples of the method of forming a film on the surface of the soft metal include processes such as wet electroplating, ion electroplating, and so forth. As the wet electroplating, there are in widespread use nickel electroplating, nickel-phosphorus alloy electroplating, nickel-palladium alloy electroplating and so forth, however, a electroplating film formed by any of the processes described is soft and has not reached such a condition as to eliminate the risk of scratches being caused by impacts.

On the other hand, as the ion electroplating, there are cited processes of forming a film such as a hard carbon film, titanium nitride film, and so froth. However, since it is difficult to directly coat the soft metal, such as aluminum, aluminum alloy, brass, copper, copper alloy and so forth, with the hard carbon film, there is the need for forming the hard carbon film with an intermediate layer made of silicon, germanium, titanium and so forth, interposed therebetween. As a result, there exist more interfaces in this case due to the presence of the intermediate layer than in the case of directly coating the soft metal, resulting in a tendency that the hard carbon film is prone to peeling to that extent. Further, the titanium nitride film has poor adhesion property against the soft metal due to its high internal stress, so that the titanium nitride film has a property to be prone to peeling. Thus, with the ion electroplating, there has not been completely solved a problem that, whichever film is formed, the film is prone to peeling. Furthermore, there exists another problem that once the film, which is so important, is peeled, part of the soft metal itself is exposed, so that initiation of corrosion starts from that part, thereby rendering the soft metal unfit for use in the soft metal article.

As methods of directly hardening the soft metal itself, there have been known ion implantation, ion nitriding, gas nitriding, carburizing, and so forth. However, with any of those methods, since many hours are required in application of a hardening treatment, a soft metal article can not be efficiently produced. In addition, with the use of any of those methods, grain coarsening of the soft metal results because of high temperature needed for the hardening treatment, thereby involving the risk of occurrence of surface roughness. For example, upon application of a gas nitriding to a soft metal article after applying a mirror surface polishing thereto, there occurs surface roughness of 200 to 300 μm due to the grain coarsening of the soft metal article after the gas nitriding, thereby causing a mirror surface to disappear, whereupon it becomes impossible to restore a mirror surface condition which has existed prior to the application of the gas nitriding even if a polishing is applied thereto thereafter, so that quality will be considerably impaired in terms of decorativeness of the external appearance.

The invention has been developed to solve the problems described above, and it is an object of the invention to provide a soft metal, a method of producing the same, a decorative article using the same, and a method of producing the decorative article, wherein the surface thereof is rendered insusceptible to scratches by enhancing impact resistance and initiation of corrosion is prevented by improving corrosion resistance so as not to impair decorativeness thereof.

DISCLOSURE OF THE INVENTION

A soft metal according to the invention is characterized in that a film made of an amorphous alloy is formed on the surface thereof.

Because a hard layer made of an amorphous alloy has excellent corrosion resistance against acid and alkali, and high mechanical strength, the surface of the soft metal is insusceptible to scratches, and initiation of corrosion. Further, if a pre-polishing is applied to the soft metal as an underlying base so as to have highly mirror polished surface, the soft metal can maintain such highly mirror polished surface as initially provided even after the formation of the hard layer made of the amorphous alloy because the amorphous alloy has highly mirror polished surface, so that decorative quality of the soft metal and a decorative article can be enhanced to that extent. Further, because the hard layer made of the amorphous alloy has excellent adhesion property with the soft metal, there does not occur peeling of the hard layer.

Further, the invention provides a soft metal with a film formed thereon, the film containing phosphorus and either platinum or palladium, and further, at least one element having homogeneous solubility with platinum or palladium, with the content of the phosphorus being in a range of about 15 to 25 atomic %.

The soft metal preferably contains nickel as one of elements having homogeneous solubility with platinum or palladium.

With the soft metal according to the invention, a film formed thereon may be made of an alloy selected from the group consisting of a platinum-copper-nickel-phosphorus alloy, platinum-nickel-phosphorus alloy, palladium-copper-nickel-phosphorus alloy, palladium-nickel-phosphorus alloy, palladium-platinum-copper-nickel-phosphorus alloy, and palladium-platinum-nickel-phosphorus alloy.

The invention also provides a soft metal with a film formed thereon, the film containing cobalt, and at least one element selected from the elements belonging to periodic table groups IVa, Va, or VIa, respectively, with the content of the cobalt being in a range of from about 55 to 95 atomic %.

With the soft metal described above, one element selected from the elements belonging to periodic table groups IVa, Va, or VIa, respectively, is preferably any of zirconium, niobium, and tantalum.

Further, with the soft metal according to the invention, a film formed thereon may be made of an alloy selected from the group consisting of a cobalt-zirconium alloy, cobalt-niobium-zirconium alloy, cobalt-niobium-titanium alloy, cobalt-zirconium-chromium alloy, cobalt-niobium-zirconium alloy, cobalt-niobium-zirconium-tantalum alloy, cobalt-niobium-zirconium-tantalum alloy, and cobalt-niobium-zirconium-titanium alloy.

Still further, the invention also provides a soft metal with a film formed thereon, the film containing boron and iron with the content of the boron being in a range of from about 15 to 25 atomic %.

The film of the soft metal described above preferably contains zirconium.

Yet further, with the soft metal according to the invention, a film formed thereon may be made of an alloy selected from the group consisting of an iron-cobalt-nickel-zirconium-boron alloy, iron-chromium-nickel-zirconium-boron alloy, iron-cobalt-nickel-niobium zirconium-boron alloy, iron-cobalt-nickel-tantalum-zirconium-boron alloy, iron-cobalt-chromium-nickel-niobium-zirconium-boron alloy, and iron-cobalt-chromium-nickel-tantalum-zirconium-boron alloy.

Further, with the soft metal according to the invention, a film formed thereon may be made of a gold-germanium-silicon alloy or a palladium-copper-silicon alloy.

A noble metal layer is preferably formed on the above-described film of the soft metal, and the noble metal layer can be made of platinum or palladium.

The invention provides a method of producing a soft metal comprising the steps of disposing a soft metal and a target made of a predetermined alloy in a vacuum apparatus, and depositing atoms of metals composing the target on the surface of the soft metal, thereby forming a film made of an amorphous alloy composed of the atoms of the metals on the surface thereof.

Further, the invention also provides a method of producing a soft metal comprising the steps of disposing a soft metal and a target made of a predetermined alloy in the plasma atmosphere of a mixed gas containing an inert gas and a non-metallic element or a metalloid element, and depositing atoms of metals composing the target and atoms contained in the mixed gas on the surface of the soft metal, thereby forming a film made of an amorphous alloy composed of the atoms of the metals and the atoms contained in the mixed gas on the surface thereof.

Still further, the invention also provides a method of producing a soft metal comprising the steps of disposing a soft metal and a target made of a predetermined alloy in the plasma atmosphere of an inert gas, depositing atoms of metals composing the target on the surface of the soft metal, thereby forming an alloy layer composed of the atoms of the metals on the surface thereof, and applying a plasma treatment in the plasma atmosphere of a mixed gas containing an inert gas and a non-metallic element or a metalloid element, thereby implementing surface modification of the alloy layer so as to be turned into a film of an amorphous alloy containing atoms contained in the mixed gas as well.

As the mixed gas containing the non-metallic element or the metalloid element, a gas containing phosphoprus, germanium, boron, or silicon is preferably used.

The invention also provides a method of producing a soft metal, further comprising the step of forming a noble metal layer on top of the film made of the amorphous alloy after the abovedescribed step of forming the film made of the amorphous alloy on the surface of the soft metal.

Next, the invention further provides a decorative article made of the soft metal with the film made of the amorphous alloy, formed on the surface thereof.

Further, the invention provides a decorative article made of the soft metal with the film formed thereon, the film containing cobalt, and at least one element selected from the elements belonging to periodic table groups IVa, Va, or VIa, respectively, with the content of the cobalt being in a range of from about 55 to 95 atomic %.

With the decorative article described above, one element selected from the elements belonging to periodic table groups IVa, Va, or VIa, respectively, is preferably zirconium, niobium, or tantalum.

Further, with the decorative article according to the invention, the film formed thereon is preferably made of an alloy selected from the group consisting of a cobalt-zirconium alloy, cobalt-niobium-zirconium alloy, cobalt-niobium-titanium alloy, cobalt-zirconium-chromium alloy, cobalt-niobium-zirconium alloy, cobalt-niobium-zirconium-tantalum alloy, cobalt-niobium-titanium alloy, cobalt-niobium-zirconium-tantalum alloy, and cobalt-niobium-zirconium-titanium alloy.

Still further, the invention also provides a decorative article with the film formed thereon, the film containing boron and iron with the content of the boron being in a range of from about 15 to 25 atomic %.

With the decorative article described above, the film preferably contains zirconium.

With the decorative article according to the invention, the film formed thereon is preferably made of an alloy selected from the group consisting of an iron-cobalt-nickel-zirconium-boron alloy, iron-chromium-nickel-zirconium-boron alloy, iron-cobalt-nickel-niobium zirconium-boron alloy, iron-cobalt-nickel-tantalum-zirconium-boron alloy, iron-cobalt-chromium-nickel-niobium-zirconium-boron alloy, and iron-cobalt-chromium-nickel-tantalum-zirconium-boron alloy.

With the decorative article according to the invention, the film may be formed on the outer surface of an intermediate layer made of nickel or an nickel alloy.

Further, a noble metal layer is preferably formed on top of the film. The noble metal layer may be made of platinum or palladium.

Further, the invention provides a method of producing a decorative article, comprising the steps of disposing a decorative article and a target made of a predetermined alloy in a vacuum apparatus, and depositing atoms of metals composing the target on the surface of the decorative article, thereby forming a film made of an amorphous alloy composed of the atoms of the metals on the surface thereof.

Still further, the invention provides a method of producing a decorative article, comprising the steps of disposing a decorative article and a target made of a predetermined alloy in the plasma atmosphere of a mixed gas containing an inert gas and a non-metallic element or a metalloid element, and depositing atoms of metals composing the target and atoms contained in the mixed gas on the surface of the decorative article, thereby forming a film made of an amorphous alloy composed of the atoms of the metals and the atoms contained in the mixed gas on the surface thereof.

Yet further, the invention also provides a method of producing a decorative article, comprising the steps of disposing a decorative article and a target made of a predetermined alloy in the plasma atmosphere of an inert gas, depositing atoms of metals composing the target on the surface of the decorative article, thereby forming an alloy layer composed of the atoms of the metals on the surface thereof, and applying a plasma treatment in the plasma atmosphere of a mixed gas containing an inert gas and a non-metallic element or a metalloid element, thereby implementing surface modification of the alloy layer so as to be turned into a film of an amorphous alloy containing atoms contained in the mixed gas as well.

The method of producing the decorative article as described above preferably comprise further the step of forming a noble metal layer on top of the film made of the amorphous alloy after the step of forming the film made of the amorphous alloy on the surface of the decorative article.

BEST MODE FOR CARRYING OUT THE INVENTION

Preferred embodiments of a soft metal, a method of producing the same, a decorative article, and a method of producing the decorative article, according to the invention, are described in detail hereinafter with reference to the accompanying drawings. First, the soft metal and the method of producing the same, according to the invention, are described.

First Embodiment

Figure 1:
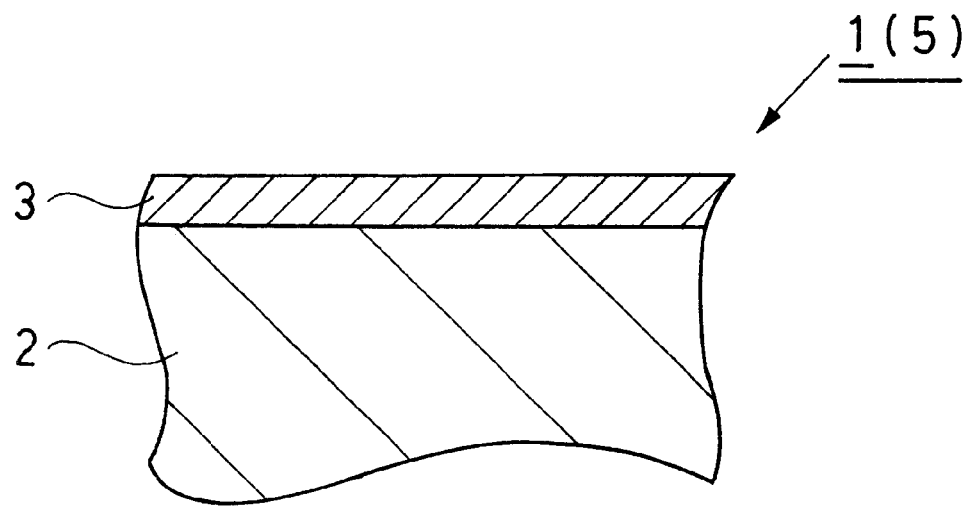
FIG. 1 is a schematic sectional view of a first embodiment of a soft metal according to the invention, showing the principal part thereof as enlarged.

FIG. 1 is an enlarged schematic sectional view of a first embodiment of a soft metal 1 according to the invention, showing the principal part thereof. The soft metal 1 is comprised of a soft metal portion 2 and a hard layer 3 formed on the surface of the soft metal portion 2, and the hard layer 3 is made of an amorphous alloy. The hard layer 3 is thin in thickness in comparison with the soft metal portion 2, omitting therefore the hard layer 3 on both the right and left sides as well as the underside of the soft metal portion 2 in FIG. 1.

EXAMPLE 1

First, a structure of the soft metal 1, a method of producing the same, and operation effects of the same are specifically described by taking an example of a soft metal article 5 described hereinafter.

The soft metal article 5 is produced by disposing a soft metal article 6 obtained by working a soft metal, such as stainless steel, iron base alloy, titanium, titanium alloy, aluminum, aluminum alloy, brass, copper, copper alloy, magnesium, and magnesium alloy, into desired shapes of various components, and a target in an inert gas plasma atmosphere, thereby forming the hard layer 3 made of an amorphous alloy on the surface thereof by causing atoms of metals composing the target to be deposited on the surface. Now, the structure of the soft metal article 5, a method of producing the same, and operation effects of the same are specifically described hereinafter.

Figure 3:
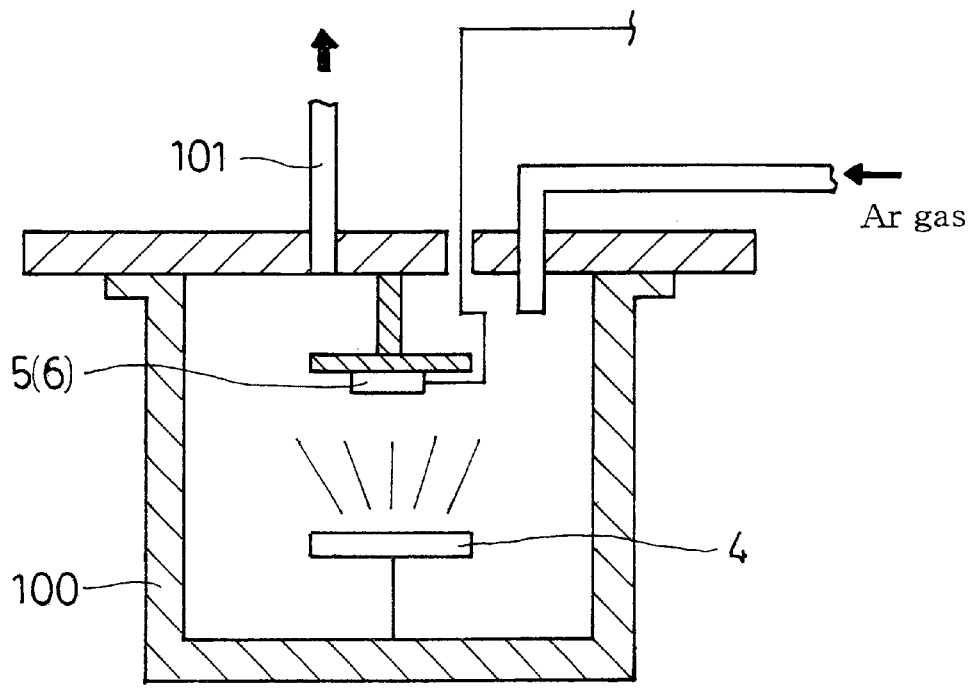
FIG. 3 is a schematic sectional view of a vacuum apparatus wherein an amorphous alloy film is formed on the surface of a soft metal.

The soft metal article 5 is produced in the following manner. As shown in FIG. 3, the soft metal article 6 and a target 4 are first disposed inside a vacuum apparatus 100. Subsequently, the vacuum apparatus 100 is evacuating it through a pump 101, and thereafter, an argon (Ar) gas is fed therein to thereby cause a plasma to occur at a pressure in the order of $5 \times 10^{-2}$ Torr, lower than a sputtering pressure subsequently to keep with an internal pressure maintained in the order of $5 \times 10^{-3}$ Torr. And a film composed of metals composing the target 4 is formed on the surface of the soft metal article 6 in such a atmosphere by a sputtering method (for example, RF magnetron sputtering, RF sputtering, DC sputtering or so forth), and the soft metal article 6 provided with the film which is the hard layer 3 made of the amorphous alloy is designated as the soft metal article 5.

In this case, for the soft metal article 6, use was made of three kinds of soft metals, that is, aluminum (Al), brass, and stainless steel (SUS304) as samples while, for the target 4, use was made of two kinds of alloys, that is, a platinum-copper-nickel-phosphorus alloy (Pt—Cu—Ni—P alloy) and a platinum-nickel-phosphorus alloy (Pt—Ni—P alloy), several kinds of the respective alloys being prepared so as to have optional composition ratios of respective constituent metals. Then, with three kinds of samples of the soft metal article 6 as an object, a film was formed on the surface of the respective soft metal articles 6 by the method described above while varying in sequence the composition of the target 4.

Figure 2:
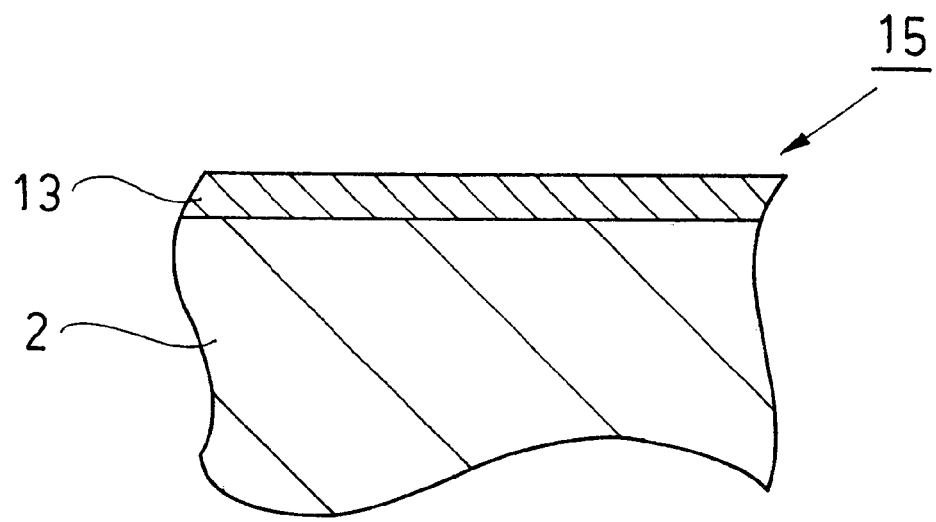
FIG. 2 is a schematic sectional view of a comparative example of a soft metal with a electroplating film formed thereon, showing the principal part thereof as enlarged.

Further, as shown in FIG. 2, with the use of the soft metal articles 6 made of three kinds of soft metals including aluminum (Al), brass, and stainless steel (SUS304), respectively, a Ni—P electroplating film was formed on the surface of the respective soft metal articles 6 by a wet electroplating process, thereby producing three kinds in total of soft metal articles 15 as comparative samples. With these soft metal articles 6 and soft metal articles 15, an evaluation on four items, that is, crystallinity, adhesion property, hardness, and corrosion resistance, was made, respectively, according to the following procedure.

First, with the respective soft metal articles 6, the film formed thereon was subjected to the ICP-AES (Inductively Coupled Plasma-Atomic Emission Spectroscopy), and the alloying composition thereof was thereby identified. Further, as for crystallinity of the film, measurement by the X-ray diffraction (θ-2 θ method) was conducted making an evaluation such that the film showing a broad peak typical of an amorphous alloy was acceptable as an amorphous alloy while the film showing a crystal peak as observed was determined as crystalline, and consequently, unacceptable as an amorphous alloy. As for adhesion property, a scratch test for scratching the surface of the film was conducted to measure a peeling starting load, and an evaluation was made on adhesion property of the film such that the film with the peeling starting load of not less than 400 gf was acceptable. Further, hardness of the surface of the film was measured with a Vickers hardness tester, and an evaluation was made on the hardness such that the film having not less than Hv=500 of Vickers hardness under the condition of a load of 100 gf was acceptable. An evaluation on corrosion resistance of the film was made such that after immersion of the film in a CASS testing (Copper Accelerated Acetic Acid Salt Splay testing) solution for 48 hours, the film to which no corrosion occurred at all was acceptable. Now, the film evaluated as acceptable on all the four items of crystallinity, adhesion property, hardness, and corrosion resistance was determined as acceptable in overall evaluation. An evaluation was made on the respective soft metal articles 6 and the respective soft metal articles 15, with the film formed thereon according to the procedure as described above, respectively, whereupon it was found that the respective films were formed of metallic elements composing the target 4, and twelve kinds of samples shown in Table 1 were determined as acceptable in overall evaluation. As is evident form Table 1, it has been confirmed that the respective films in the following cases are the hard layers 3 made of an amorphous alloy.

TABLE 1

| | soft metal | alloying composition (atomic %) | | | | crystallinity | adhesion property peeling starting load (gf) | hardness (Hv) | corrosion resistance corrosion | overall evaluation |
|---|---|---|---|---|---|---|---|---|---|---|
| | | Pt | Cu | Ni | P | | | | | |
| example 1 | Al | 40 | 30 | 10 | 20 | amorphous | 440 | 610 | no | acceptable |
| | Al | 60 | 10 | 10 | 20 | amorphous | 430 | 580 | no | acceptable |
| | Al | 60 | | 20 | 20 | amorphous | 410 | 530 | no | acceptable |
| | Al | 65 | | 15 | 20 | amorphous | 410 | 540 | no | acceptable |
| | brass | 40 | 30 | 10 | 20 | amorphous | 440 | 610 | no | acceptable |
| | brass | 60 | 10 | 10 | 20 | amorphous | 440 | 620 | no | acceptable |
| | brass | 60 | | 20 | 20 | amorphous | 430 | 580 | no | acceptable |
| | brass | 65 | | 15 | 20 | amorphous | 420 | 550 | no | acceptable |
| | SUS304 | 40 | 30 | 10 | 20 | amorphous | 450 | 650 | no | acceptable |
| | SUS304 | 60 | 10 | 10 | 20 | amorphous | 430 | 590 | no | acceptable |
| | SUS304 | 60 | | 20 | 20 | amorphous | 420 | 550 | no | acceptable |
| | SUS304 | 65 | | 15 | 20 | amorphous | 420 | 550 | no | acceptable |
| | | plating film | | | | | | | | |
| comparative sample | Al | Ni—P plating | | | | unmeasured | 350 | 320 | exist | unacceptable |
| | brass | Ni—P plating | | | | unmeasured | 360 | 350 | exist | unacceptable |
| | SUS304 | Ni—P plating | | | | unmeasured | 330 | 360 | exist | unacceptable |

In the case of using a Pt—Cu—Ni—P alloy for the target 4, a composition ratio of the metals composing the respective films was either at 40:30:10:20 or at 60:10:10:20 by atomic % for platinum (Pt):copper (Cu):nickel (Ni):phosphorus (P). Further, in the case of using a Pt—Ni—P alloy for the target 4, a composition ratio of the metals composing the respective films was either at 60:20:20 or at 65:15:20 by atomic % for Pt:Ni:P. That is, since the films having four different composition ratios as described above showed a broad peak typical of an amorphous alloy as a result of the X-ray diffraction, respectively, it was confirmed that the crystallinity thereof was amorphous, and was thereby determined as acceptable (peaks appearing upon the X-ray diffraction are not shown). Further, as a result of evaluation made on the adhesion property, it was confirmed that any of the films had a peeling starting load according to a scratch test at minimum 410 gf, and maximum 450 gf, being not less than 400 gf in any case, and consequently, the adhesion property was determined as acceptable. Still further, as a result of evaluation made on the hardness, it was confirmed that any of the films had Vickers hardness at minimum Hv=530, and maximum Hv=650, being not less than Hv=500, and consequently, the hardness was determined as acceptable. Yet further, since it was also confirmed as a result of evaluation made on the corrosion resistance that no corrosion occurred to the films after the CASS testing, the corrosion resistance thereof was determined as acceptable. Thus, based on the results of the evaluations described above, it has been confirmed that among the soft metal articles 6 with the film formed thereon, respectively, according to the procedure as described above, those with at least the four kinds of the films described above, formed thereon, respectively, are determined as acceptable in overall evaluation, and are the soft metal articles 5 with the hard layer 3 made of the amorphous alloy, formed thereon, respectively.

Upon checking the alloying composition of the respective hard layers 3 made of the amorphous alloy, it is understood that any of the hard layers 3 contains Pt, Ni, and P, and Pt and Ni are elements in Group VIII of the periodic table of the elements, having homogeneous solubility with each other, and containing about 20 atomic % of P.

In contrast, with the soft metal articles 15 produced as the comparative samples, a peeling starting load of the soft metal articles 15 at a scratch test was found at 330 gf, 350 gf, and 360 gf, respectively, indicating that the peeling starting load of any of the comparative samples was less than 400 gf, so that it was confirmed that the adhesion property thereof was evaluated as unacceptable. Further, the hardness of the soft metal articles 15 was found at Hv=320, Hv=350, and Hv=360, of Vickers hardness, respectively, indicating that the hardness of any of the comparative samples was Hv=less than 400, so that the hardness thereof was determined as unacceptable. Still further, since corrosion occurred to the comparative samples after the CASS testing, it was determined that corrosion resistance as well was evaluated as unacceptable. Accordingly, the soft metal articles 15 produced as the comparative samples were found unacceptable in overall evaluation.

EXAMPLE 2

Figure 6:
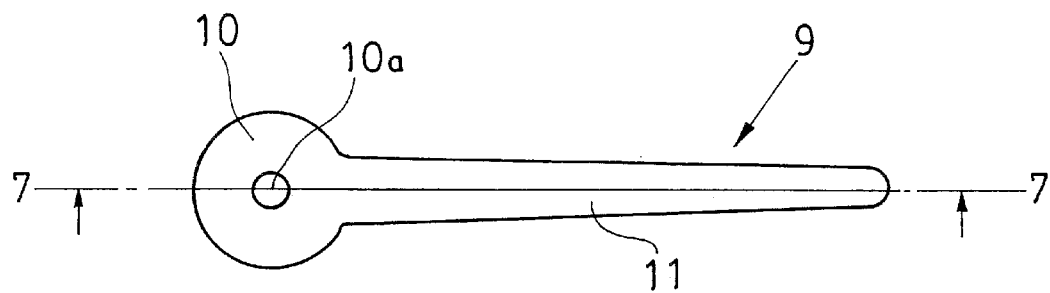
FIG. 6 is a plan view showing a guide point with an amorphous alloy film formed thereon.
Figure 7:
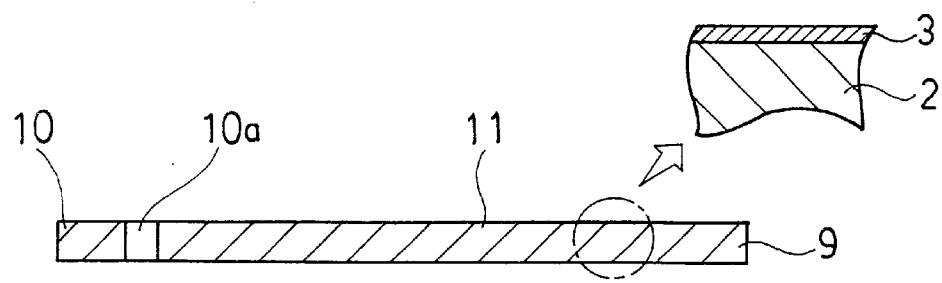
FIG. 7 is a sectional view taken on line 7—7 in FIG. 6.

With Example 2, use is made of a guide point 9 as shown in FIGS. 6 and 7 besides a soft metal article 6. Example 2 is similar to the first embodiment except that constituent materials of the soft metal article 6 and a target 4 are different from those for the first embodiment, and accordingly, description centering around points of difference will be given hereinafter, omitting or simplifying points common to both Examples 1 and 2.

The guide point 9 is a part for a diameter articles of knitting machine, and is generally made up of a thin sheet of an iron base alloy such as SK3 and the like. As shown in FIGS. 6 and 7, the guide point 9 is comprised of a head part 10 having a hole 10a through which a thread is passed, and a leg part 11 in a tapered shape with width gradually reduced in a direction from the head part 10 towards the tip of the leg part 11.

In this Example, for the soft metal article 6, use is made of three kinds of soft metals as samples, that is, aluminum (Al), brass, and an iron base alloy (SK3) among the previously described soft metals. For the target 4, use is made of alloys composed of cobalt (Co) as its main constituent, with addition, as appropriate, of chips made of niobium (Nb), zirconium (Zr), and titanium (Ti), respectively, such that elements Co, Nb, Zr, and Ti are mixed with each other at optional composition ratios when using the soft metal article 6 while use is made of an alloy having an approximate composition ratio of cobalt, niobium, and zirconium at 87:8:5 by atomic % when using the guide point 9. Further, with this Example as well, the soft metal articles 15 as comparative samples are produced by the same procedure as that for Example 1 by use of three kinds of soft metals, that is, aluminum (Al), brass, and an iron base alloy (SK3) for samples.

As with the case of Example 1, the respective soft metal articles 6 or the respective guide points 9 and the respective targets 4 were disposed inside a vacuum apparatus 100, and a film made of metals composing the respective targets 4 was formed in an argon gas atmosphere by a sputtering method (for example, RF magnetron sputtering, RF sputtering, DC sputtering or so forth). Subsequently to the formation of the respective films, the alloying composition thereof was identified by the same procedure as that for Example 1, whereupon it was found that any of the films was composed of metallic elements composing the respective targets 4. Thereafter, with respect to all the films, an evaluation was made on four items, that is, crystallinity, adhesion property, hardness, and corrosion resistance, respectively. As a result, it was determined that ten different samples shown in Table 2 were acceptable in overall evaluation.

As is evident from Table 2, it has been confirmed that a hard layer 3 is made of an amorphous alloy in the case where the respective targets 4 are made of the following three different alloys. That is, in the case of the target 4 being made of a cobalt-zirconium alloy (Co—Zr alloy), a cobalt-niobium zirconium alloy (Co—Nb—Zr alloy), and a cobalt-niobium-titanium (Co—Nb—Ti alloy), respectively.

TABLE 2

|  | soft metal | alloy composed of Co as its main constituent atomic % | | | | crystallinity | adhesion property peeling starting load (gf) | hardness (Hv) | corrosion resistance corrosion | overall evaluation |
| --- | --- | --- | --- | --- | --- | --- | --- | --- | --- | --- |
|  |  | Co | Nb | Zr | Ti |  |  |  |  |  |
| example 2 | Al | 95 |  | 5 |  | amorphous | 430 | 620 | no | acceptable |
|  | Al | 87 | 8 | 5 |  | amorphous | 420 | 500 | no | acceptable |
|  | Al | 85 | 10 |  | 5 | amorphous | 450 | 620 | no | acceptable |

TABLE 2-continued

| | soft metal | alloy composed of Co as its main constituent atomic % | | | | crystallinity | adhesion property peeling starting load (gf) | hardness (Hv) | corrosion resistance corrosion | overall evaluation |
|---|---|---|---|---|---|---|---|---|---|---|
| | | Co | Nb | Zr | Ti | | | | | |
| | brass | 95 | | 5 | | amorphous | 450 | 500 | no | acceptable |
| | brass | 87 | 8 | 5 | | amorphous | 460 | 620 | no | acceptable |
| | brass | 85 | 10 | | 5 | amorphous | 430 | 500 | no | acceptable |
| | SK3 | 95 | | 5 | | amorphous | 450 | 620 | no | acceptable |
| | SK3 | 87 | 8 | 5 | | amorphous | 410 | 500 | no | acceptable |
| | SK3 | 85 | 10 | | 5 | amorphous | 450 | 620 | no | acceptable |
| | guide point | 87 | 8 | 5 | | amorphous | 450 | 620 | no | acceptable |
| | | plating film | | | | | | | | |
| comparative sample | Al | Ni—P plating | | | | unmeasured | 350 | 250 | exist | unacceptable |
| | brass | Ni—P plating | | | | unmeasured | 380 | 350 | exist | unacceptable |
| | SK3 | Ni—P plating | | | | unmeasured | 300 | 450 | exist | unacceptable |

Further, it was confirmed based on the results of the X-ray diffraction that, with the film having at least the following composition ratios of respective metals composing the film, the crystallinity thereof was amorphous. That is, in the case of the Co—Zr alloy having an approximate composition ratio of Co:Zr at 95:5 by atomic %, in the case of the Co—Nb—Zr alloy having an approximate composition ratio of Co:Nb:Zr at 87:8:5 by atomic %, and in the case of the Co—Nb—Ti alloy having an approximate composition ratio of Co:Nb:Ti at 85:10:5 by atomic %. Further, with the guide point 9, it has been confirmed that the hard layer 3 was made of an amorphous alloy having an approximate composition ratio of Co:Nb:Zr at 87:8:5 by atomic %.

Furthermore, the results of evaluation on the four items, such as crystallinity, and so on, are described as follows. More specifically, because a peeling starting load of the respective films was found at maximum 460 gf, and minimum 410 gf, being not less than 400 gf in any case, the adhesion property of the respective films was determined as acceptable. Further, because the surface hardness of any of the films was maximum Hv=620 of Vickers hardness, and minimum Hv=500, being not less than Hv=500 in any case, the surface hardness was determined as acceptable. Still further, because no corrosion occurred to the respective films after the CASS testing, the corrosion resistance of the surface of the respective films was determined as acceptable. It was determined on the basis of the evaluations made as above that the soft metal articles 6 with the hard layer 3 as described in the foregoing, formed thereon, were acceptable as soft metal articles 5 in overall evaluation.

In contrast, with the soft metal articles 15 produced as the comparative samples, a peeling starting load thereof at a scratch test was found at 300 gf, 350 gf, and 380 gf, respectively, indicating that the peeling starting load of any of the comparative samples was at less than 400 gf, so that it was confirmed that the adhesion property thereof was evaluated as unacceptable. Further, because the hardness of the soft metal articles 15 was found at Hv=250, Hv=350, and Hv=450, respectively, of Vickers hardness, indicating that the hardness of the comparative samples except some thereof was at less than Hv=400, it was determined that the hardness thereof was unacceptable. Still further, since corrosion occurred to the comparative samples after the CASS testing, it was determined that corrosion resistance as well was evaluated as unacceptable. Accordingly, it was determined that the soft metal articles 15 produced as the comparative samples were unacceptable in overall evaluation.

EXAMPLE 3

Example 3 is similar to Example 1 except that constituent materials of a soft metal article 6 and a target 4 are different from those for Example 1, and accordingly, description centering around points of difference will be given hereinafter, omitting or simplifying points common to both Examples 1 and 3.

In this Example, for the soft metal article 6, use is made of a stainless steel (SUS304) among the previously described soft metals as a sample. For the target 4, use is made of alloys made of cobalt (Co) as its main constituent, with addition, as appropriate, of chips made of niobium (Nb), zirconium (Zr), chromium (Cr), tantalum (Ta), and titanium (Ti), respectively, such that elements Co, Nb, Zr, Cr, Ta, and Ti are mixed with each other at optional composition ratios.

As with the case of Example 1, the respective soft metal articles 6 and the respective targets 4 were disposed inside a vacuum apparatus 100, and a film made of metals composing the respective targets 4 was formed in an argon gas atmosphere by the DC sputtering method. Subsequently to the formation of the respective films, the alloying composition thereof was identified by the same procedure as that for Example 1, whereupon it was found that any of the films was composed of metallic elements composing the respective targets 4. Thereafter, with respect to the respective films, an evaluation was made on four items, that is, crystallinity, adhesion property, hardness, and corrosion resistance, respectively. As a result, it was determined that seven different samples shown in Table 3 were acceptable in overall evaluation.

TABLE 3

| alloying composition (atomic %) | | | | | | | adhesion property peeling starting load (gf) | hardness (Hv) | corrosion resistance corrosion | overall evaluation |
|---|---|---|---|---|---|---|---|---|---|---|
| Co | Nb | Zr | Cr | Ta | Ti | crystallinity | | | | |
| 95 |   | 5 |   |   |   | amorphous | 450 | 550 | no | acceptable |
| 86 |   | 8 | 6 |   |   | amorphous | 500 | 580 | no | acceptable |
| 85 | 10 | 5 |   |   |   | amorphous | 550 | 600 | no | acceptable |
| 82 | 10 | 6 |   | 2 |   | amorphous | 550 | 610 | no | acceptable |
| 85 | 8 |   |   |   | 7 | amorphous | 420 | 530 | no | acceptable |
| 78 | 10 | 8 |   | 4 |   | amorphous | 400 | 500 | no | acceptable |
| 78 | 10 | 8 |   |   | 4 | amorphous | 400 | 500 | no | acceptable |

As is evident from Table 3, it has been confirmed that a hard layer 3 is made of an amorphous alloy in the case where the respective targets 4 are made of the following seven different alloys. That is, in the case of the target 4 being made of a cobalt-zirconium alloy (Co—Zr alloy), a cobalt-zirconium-chromium alloy (Co—Zr—Cr alloy), a cobalt-niobium-zirconium alloy (Co—Nb—Zr alloy), a cobalt-niobium-zirconium-tantalum alloy (Co—Nb—Zr—Ta alloy), a cobalt-niobium-titanium alloy (Co—Nb—Ti alloy), a cobalt-niobium-zirconium-tantalum alloy (Co—Nb—Zr—Ta alloy), and a cobalt-niobium-zirconium-titanium alloy (Co—Nb—Zr—Ti alloy), respectively.

Further, it has been confirmed based on the results of the X-ray diffraction that, at least in the case of a composition ratio of respective metals composing the respective films being as follows, the crystallinity of the respective films is amorphous. That is, in the case of the Co—Zr alloy having an approximate composition ratio of Co:Zr at 95:5 by atomic %, in the case of the Co—Zr—Cr alloy having an approximate composition ratio of Co:Zr:Cr at 86:8:6 by atomic %, and in the case of the Co—Nb—Zr alloy having an approximate composition ratio of Co:Nb:Zr at 85:10:5 by atomic %. Further, in the case of the Co—Nb—Zr—Ta alloy having an approximate composition ratio of Co:Nb:Zr:Ta at 82:10:6:2 by atomic %, in the case of the Co—Nb—Ti alloy having an approximate composition ratio of Co:Nb:Ti at 85:8:7 by atomic %, in the case of the Co—Nb—Zr—Ta alloy having an approximate composition ratio of Co:Nb:Zr:Ta at 78:10:8:4, and in the case of the Co—Nb—Zr—Ti alloy having an approximate composition ratio of Co:Nb:Zr:Ti at 78:10:8:4.

Furthermore, the results of evaluation made on the respective items, such as adhesion property, and so on, are as described below. More specifically, because a peeling starting load of the respective films was found at maximum 550 gf, and minimum 400 gf, being not less than 400 gf in any case, the adhesion property of the respective films was determined as acceptable. Further, the surface hardness was maximum Hv=610 of Vickers hardness, and minimum Hv=500, being not less than Hv=500 in any case, and was therefore determined as acceptable. Still further, because no corrosion occurred to the respective films after the CASS testing, the corrosion resistance of the surface of the respective films was determined as acceptable. It was determined on the basis of the evaluations made as above that the soft metal articles 6 with the hard layer 3 as described in the foregoing, formed thereon, were acceptable as soft metal articles 5 in overall evaluation.

EXAMPLE 4

With Example 4, a film is formed on the surface of respective soft metal articles 6 by the same procedure as that for Example 3 by varying constituent materials of the target 4 used in Example 3. The alloying composition of the respective films has matched metallic elements composing the target 4. Then, with respect to all the films, an evaluation was made on four items, that is, crystallinity, adhesion property, hardness, and corrosion resistance, respectively, by the same procedure as for Example 1. Those which are determined as acceptable in overall evaluation as a result of such evaluations are as shown in Table 4.

It was found that a film made of an alloy selected from the group consisting of a Co—Nb—Zr alloy, a Co—Nb—Ta—Zr alloy, and a Co—Nb—Ti—Zr alloy was formed on the surface of the respective soft metal articles 6, and it has been confirmed based on the results of the X-ray diffraction that, at least in the following cases, the respective films are hard layers 3 made of an amorphous alloy.

That is, in the case of the Co—Nb—Zr alloy having an approximate composition ratio of Co:Nb:Zr at 55:30:15, 60:20:20, 65:20:15, 75:10:15, 75:15:10, and 80:10:10, by atomic %, Further, in the case of the Co—Nb—Ta—Zr alloy having an approximate composition ratio of Co:Nb:Ta:Zr at 60:20:5:15, 60:15:5:20 and 65:15:5:15. Still further, in the case of the Co—Nb—Ti—Zr alloy having an approximate composition ratio of Co:Nb:Ti:Zr at 75:5:5:15, 75:10:5:10, and 80:5:5:10.

The results of evaluation on the respective items, such as adhesion property, and so on, are described as follows. More specifically, because a peeling starting load of the respective films was found at maximum 550 gf, and minimum 400 gf, being not less than 400 gf in any case, the adhesion property thereof was determined as acceptable. Further, the surface hardness of the respective films was maximum Hv=630 of Vickers hardness, and minimum Hv=500, being not less than Hv=500 in any case, and was therefore determined as acceptable. Still further, because no corrosion occurred to the respective films after the CASS testing, the corrosion resistance of the surface of the respective films was determined as acceptable. It was determined on the basis of the evaluations made as above that the soft metal articles 6 with the hard layer 3 as described in the foregoing, formed thereon, were acceptable as soft metal articles 5 in overall evaluation.

TABLE 4

| alloying composition (atomic %) | | | | | | adhesion property peeling starting load (gf) | hardness (Hv) | corrosion resistance corrosion | overall evaluation |
|---|---|---|---|---|---|---|---|---|---|
| Co | Nb | Ta | Ti | Zr | crystallinity | | | | |
| 55 | 30 | | | 15 | amorphous | 400 | 510 | no | acceptable |
| 60 | 20 | | | 20 | amorphous | 450 | 570 | no | acceptable |
| 65 | 20 | | | 15 | amorphous | 500 | 570 | no | acceptable |
| 75 | 10 | | | 15 | amorphous | 500 | 590 | no | acceptable |
| 75 | 15 | | | 10 | amorphous | 450 | 560 | no | acceptable |
| 80 | 10 | | | 10 | amorphous | 550 | 630 | no | acceptable |
| 60 | 20 | 5 | | 15 | amorphous | 430 | 520 | no | acceptable |
| 60 | 15 | 5 | | 20 | amorphous | 450 | 540 | no | acceptable |
| 65 | 15 | 5 | | 15 | amorphous | 520 | 600 | no | acceptable |
| 75 | 5 | | 5 | 15 | amorphous | 440 | 560 | no | acceptable |
| 75 | 10 | | 5 | 10 | amorphous | 410 | 500 | no | acceptable |
| 80 | 5 | | 5 | 10 | amorphous | 540 | 600 | no | acceptable |

It is reasoned from the results on Examples 2 to 4 that if the film contains Co, and at least one element selected from the group consisting of Zr, Nb, Ta, Cr, and so forth, belonging to periodic table groups IVa, Va, and VIa, respectively, with the content of Co being in a range of from about 55 to 95 atomic %, the film constitutes the hard layer 3 made of an amorphous alloy. Accordingly, it is reasoned that, with the use of the following alloys containing Co for the target 4, the hard layer 3 made of an amorphous alloy can be formed on the surface of the respective soft metal articles 6. For example, in the case of using such alloys as a Co—Hf—Pd alloy, and a Co—Hf—Pt alloy, containing hafnium (Hf), and other alloys such as a Co—Ti alloy, Co-W alloy, and a Co—Cr alloy. Further, since the results on Examples 2 to 4 show that the metals other than Co include any of Zr, Nb, and Ta, it is reasoned that the film constitutes the hard layer 3 made of an amorphous alloy if at least one element selected from the group consisting of elements belonging to periodic table groups IVa, Va, and VIa, respectively, is any of Zr, Nb, and Ta. If so, besides those alloys described in the foregoing, use may be made of such alloys as a Co—Ni—Nb alloy, a Co—Ni—Zr alloy, and a Co—Ni—Nb—Zr alloy, containing nickel (Ni), a Co—Fe—Nb alloy, a Co—Fe—Zr alloy, and a Co—Fe—Nb—Zr alloy, containing iron (Fe). Also, use may be made of a Co—Nb alloy, a Co—Ta alloy, a Co—Nb—Ta alloy, and a Co—Nb—Ta—Ti —Zr alloy. Further, a Co—Pd alloy, and a Co—Pt alloy as well may be used.

With respective Examples described hereinbefore, argon (Ar) was used for an inert gas to be fed into the vacuum apparatus 100, however, helium (He), xenon (Xe), or kripton (Kr) may be fed instead of argon.

Further, the sputtering method is adopted as the method of depositing metals composing the respective targets 4 on the surface of the respective soft metal articles 6, however, in the case of using other dry processes, a PVD process, such as ion electroplating, ion beam deposition, and so forth, may be adopted. As means for generating a plasma, either a RF method or a DC method may be adopted.

Second Embodiment

As with the first embodiment of the invention, a second embodiment of a soft metal according to the invention is described hereinafter by taking an example of a soft metal article 5. In comparison with the soft metal article 5 according to the first embodiment, the soft metal article 5 according to the second embodiment is the same in structure as that for the first embodiment, but differs from that in respect of the composition of a hard layer 3, and a method of forming the hard layer 3.

More specifically, the soft metal article 5 according to the second embodiment is obtained by depositing atoms of metals composing a target and atoms contained in a mixed gas on the surface of a soft metal article 6 in the plasma atmosphere of the mixed gas containing an inert gas and a non-metallic element or a metalloid element, thereby forming the hard layer 3 made of an amorphous alloy on the surface of the soft metal article 6. The structure of the soft metal article 5, a method of producing the same, and operation effects of the same are specifically described hereinafter with respect to Examples 1 and 2, respectively.

EXAMPLE 1

As with the case of the first embodiment of the invention, the soft metal article 6 and the target 4 are disposed inside a vacuum apparatus 100, and an argon (Ar) gas is fed therein after the vacuum apparatus 100 is evacuating it through a pump 101, thereby causing a plasma to occur. Subsequently, a phosphine ($PH_3$) gas is fed therein, and an internal pressure of the vacuum apparatus 100 is maintained in the order of $5 \times 10^{-3}$ Torr Thereafter, atoms of metals composing the target 4 are sputtered in the plasma atmosphere of a mixed gas containing Ar and $PH_3$ by a sputtering method such as the RF magnetron sputtering method, and so forth, whereupon the sputtered atoms of the metals and atoms (phosphorus) contained in the mixed gas are caused to be deposited on the surface of the soft metal article 6, and a film is thereby formed. The soft metal article 6 thus provided with the film as the hard layer 3 containing phosphorus (P) is designated as the soft metal article 5. In this connection, feeding of a gas containing phosphorus will suffice, and a trimethylphosphine ($P(CH_3)_3$) gas may be fed in place of a phosphine ($PH_3$) gas.

With Example 1, for the soft metal article 6, use is made of a stainless steel (SUS316L), and for the target 4, use is made of alloys made of palladium (Pd) as its main constituent, with addition, as appropriate, of chips made of elements Cu, Ni, and Pt, respectively, such that elements Pd, Cu, Ni, and Pt are mixed with each other at respective optional composition ratios. Then, a film was formed on the surface of respective soft metal articles 6 by the procedure described above while sequentially varying the composition of the target 4 against samples of the soft metal article 6. With the respective soft metal articles 6 with the film already formed thereon, the alloying composition of the respective films was identified by the same procedure as that for the first embodiment, and an evaluation was made on four items, that is, crystallinity, adhesion property, hardness, and corrosion resistance, respectively. As a result, it was determined that twelve different samples shown in Table 5 were acceptable in overall evaluation.

TABLE 5

| amorphous alloying composition (atomic %) | | | | | | adhesion property peeling starting | hardness | corrosion resistance | overall |
|---|---|---|---|---|---|---|---|---|---|
| Pd | Pt | Cu | Ni | P | crystallinity | load (gf) | (Hv) | corrosion | evaluation |
| 40 |    | 30 | 10 | 20 | amorphous | 440 | 610 | no | acceptable |
| 50 |    | 20 | 10 | 20 | amorphous | 460 | 660 | no | acceptable |
| 60 |    | 10 | 10 | 20 | amorphous | 470 | 680 | no | acceptable |
| 60 |    |    | 20 | 20 | amorphous | 420 | 550 | no | acceptable |
| 50 |    |    | 30 | 20 | amorphous | 430 | 580 | no | acceptable |
| 60 |    |    | 25 | 15 | amorphous | 430 | 570 | no | acceptable |
| 40 | 20 | 10 | 10 | 20 | amorphous | 450 | 620 | no | acceptable |
| 40 | 10 | 20 | 10 | 20 | amorphous | 460 | 650 | no | acceptable |
| 40 | 15 | 10 | 10 | 25 | amorphous | 440 | 600 | no | acceptable |
| 40 | 20 |    | 20 | 20 | amorphous | 430 | 570 | no | acceptable |
| 55 | 10 |    | 15 | 20 | amorphous | 430 | 580 | no | acceptable |
| 60 | 10 |    | 15 | 15 | amorphous | 440 | 600 | no | acceptable |

As is evident from Table 5, it was confirmed that the respective films were the hard layers 3 made of an amorphous alloy at least in the case of the target 4 being made of the following four different alloys, respectively. That is, in the case of the target 4 being made of a palladium-copper-nickel alloy (Pd—Cu—Ni alloy), a palladium-nickel alloy (Pd—Ni alloy), a palladium-platinum-copper-nickel alloy (Pd—Pt—Cu—Ni alloy), and a palladium-platinum-nickel alloy (Pd—Pt—Ni alloy), respectively.

Further, as a result of subjecting the respective films thus formed to the ICP-AES for identifying the alloying composition thereof, it was confirmed that any of the films was made of an alloy containing these metals composing the target 4 and phosphorus (P). Furthermore, it was confirmed based on the results of the X-ray diffraction that the crystallinity of the respective films was amorphous at least in the case of the composition ratio of respective metals composing the respective films being as described below. That is, in the case of a Pd—Cu—Ni—P alloy having an approximate composition ratio of Pd:Cu:Ni:P at 40:30:10:20, 50:20:10:20, and 60:10:10:20, by atomic %, respectively. In the case of a Pd—Ni—P alloy having an approximate composition ratio of Pd:Ni:P at 60:20:20, 50:30:20, and 60:25:15, by atomic %, respectively.

Further, in the case of a Pd—Pt—Cu—Ni—P alloy having an approximate composition ratio of Pd:Pt:Cu:Ni:P at 40:20:10:10:20, 40:10:20:10:20, and 40:15:10:10:25, by atomic %, respectively. In the case of a Pd—Pt—Ni—P alloy having an approximate composition ratio of Pd:Pt:Ni:P at 40:20:20:20, 55:10:15:20, and 60:10:15:15, by atomic %, respectively.

These results show that the composition ratio of phosphorus (p) may be in a range of about 15 to 25 atomic %. Further, as with platinum, palladium is an element belonging to Group VIII, having mutually homogeneous solubility with nickel. Accordingly, taking into consideration what has been described with reference to Example 1 of the first embodiment, it is reasoned that if a film contains phosphorus (p) and either or both of platinum and palladium, and contains further at least one element having homogeneous solubility with platinum or palladium, with the content of phosphorus (p) being in a range of about 15 to 25 atomic %, the film is the hard layer 3 made of an amorphous alloy. It is also reasoned that nickel is an element having homogeneous solubility with platinum or palladium.

The results of evaluation made on the four items such as adhesion property, and so on are described as follows. More specifically, because a peeling starting load of the respective films was found at maximum 470 gf, and minimum 420 gf, being not less than 400 gf in any case, the adhesion property of the respective films was determined as acceptable. Further, the surface hardness of the respective films was maximum Hv=680 of Vickers hardness, and minimum Hv=550, being not less than Hv=500 in any case, and was therefore determined as acceptable. Still further, because no corrosion occurred to the respective films after the CASS testing, the corrosion resistance of the surface of the respective films was determined as acceptable. It was determined on the basis of the evaluation made as above that the soft metal articles 6 with twelve different samples of the hard layer 3 as described in the foregoing, formed thereon, respectively, were acceptable as soft metal articles 5 in overall evaluation.

EXAMPLE 2

Example 2 is similar to Example 1 except that a gas fed in a vacuum apparatus 100, and constituent materials of a soft metal article 6 and a target 4 differ from those for Example 1, and accordingly, description centering around points of difference will be given hereinafter, omitting or simplifying points common to both Examples 1 and 2.

With this Example, a germane ($GeH_4$) gas containing germanium instead of a phosphine ($PH_3$) gas is fed into a vacuum apparatus 100 in contrast with Example 1, and a film is formed on the surface of a soft metal article 6 in the plasma atmosphere of a mixed gas containing Ar and $GeH_4$. Further, use is made of the soft metal article 6 made of an aluminum alloy (JIS specification: AC2A), and for a target 4, use is made of an alloy composed of gold (Au) as its main constituent, with addition of a chip made of silicon (Si), as appropriate, such that elements Au and Si are mixed with each other at optional composition ratios. With the respective soft metal articles 6 with respective films formed thereon, the alloying composition of the respective films was identified by the same procedure as that for Example 1, and an evaluation was made on the four items, that is, crystallinity, adhesion property, hardness, and corrosion resistance, respectively. As a result, it was determined that one shown in Table 7 was acceptable in overall evaluation.

As shown in Table 7, it was found that the film was made of a gold-germanium-silicon alloy (Au—Ge—Si alloy) containing germanium (Ge). Further, it was confirmed based on the results of the X-ray diffraction that the crystallinity of the film was amorphous at least in the case of the film having an approximate composition ratio of Au:Ge:Si at 80:12:8 by atomic %. Further, the results of evaluations made on the four items, such as adhesion property and so on, are described as follows. More specifically, because a peeling starting load of the film was found at 410 gf, not less than 400 gf, the adhesion property of the film was determined as acceptable, and because the surface hardness of the film was Hv=530 of Vickers hardness, not less than Hv=500, the surface hardness was determined as acceptable. Still further, because no corrosion occurred to the film after the CASS testing, the corrosion resistance of the surface of the film was determined as acceptable. It was determined on the basis of the evaluations made as above that the soft metal article 6 with the abovedescribed film formed thereon was acceptable as a soft metal article 5 in overall evaluation.

Third Embodiment

As with the second embodiment of the invention, a third embodiment of a soft metal according to the invention is described hereinafter by taking an example of a soft metal article 5. In comparison with the soft metal article 5 according to the first embodiment, the soft metal article 5 according to the third embodiment is the same in structure as that for the first embodiment, but differs from that in respect of the composition of a hard layer 3, and a method of forming the hard layer 3.

More specifically, with the soft metal article 5 according to the third embodiment, an alloy layer is formed by sputtered atoms of metals composing a target from the target in the plasma atmosphere of an inert gas, and depositing the atoms on the surface of a soft metal article 6, and subsequently, surface modification of the alloy layer thus formed is implemented by applying a plasma treatment thereto in the plasma of a mixed gas containing the inert gas and a non-metallic element or a metalloid element, thereby forming the hard layer 3, made of an amorphous alloy containing atoms contained in the mixed gas as well, on the surface of the soft metal article 6. The structure of the soft metal article 5, a method of producing the same, and operation effects of the same are specifically described hereinafter with respect to Examples 1 and 2.

EXAMPLE 1

Figure 5:
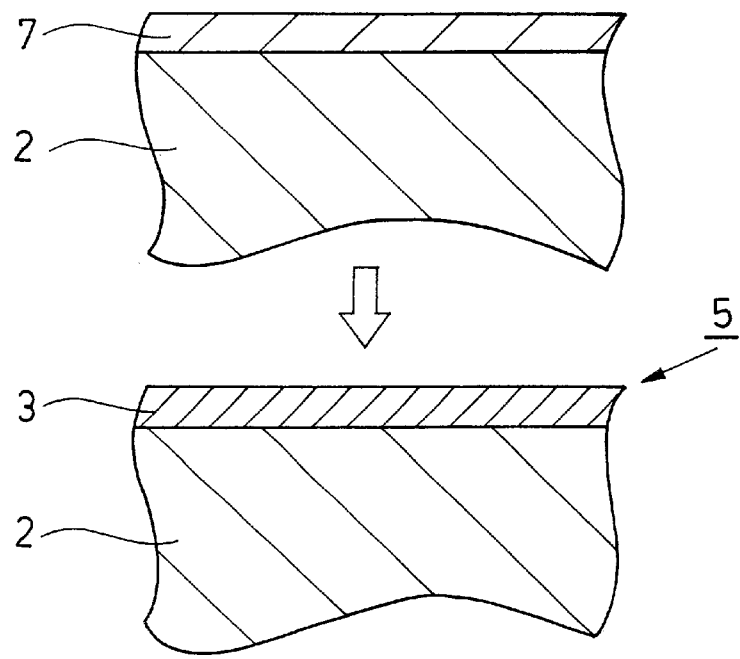
FIG. 5 shows schematic sectional views of a soft metal in the middle of production by a method different from that for the soft metal shown in FIG. 1, and a soft metal as produced, respectively, showing the enlarged principal part thereof.

As with the case of the first embodiment, after the soft metal article 6 and the target 4 are disposed inside a vacuum apparatus 100 and subsequently, the vacuum apparatus 100 is evacuating it through a pump 101, an argon (Ar) gas is fed therein to thereby cause a plasma to occur, maintaining an internal pressure of the vacuum apparatus 100 at $5 \times 10^{-3}$ Torr. Then, atoms of metals composing the target 4 are sputtered in an Ar gas plasma atmosphere by a sputtering method such as DC sputtering, and so forth, and are deposited on the surface of the soft metal article 6, thereby forming the alloy layer 7 as shown in FIG. 5. Subsequently, an Ar gas and a diborane ($B_2H_6$) gas are fed into the vacuum apparatus 100 and the internal pressure is maintained at $5 \times 10^{-3}$ Torr. In such an atmosphere, a mixed gas plasma of Ar and $B_2H_6$ is caused to occur. Thereafter, surface modification of the alloy layer 7 already formed is implemented by applying a plasma treatment thereto, and the soft metal article 6 provided with the alloy layer 7 which has been turned into the hard layer 3 made of an amorphous alloy containing atoms (boron) contained in the mixed gas is designated as a soft metal article 5. In this connection, since feeding of a gas containing boron will suffice, a trimethyl-boron ($B(CH_3)_3$) gas, for example, may be fed in place of a diborane ($B_2H_6$) gas.

With Example 1, for the soft metal article 6, use was made of an iron base alloy (SK3) as a sample, and for the target 4, use was made of alloys made of iron (Fe) as its main constituent, with addition, as appropriate, of chips made of cobalt (Co), chromium (Cr), nickel (Ni) niobium (Nb), tantalum (Ta), and zirconium (Zr), respectively, such that elements Fe, Co, Cr, Ni, Nb, Ta, and Zr are mixed with each other at optional composition ratios. With the respective soft metal articles 6 with respective films already formed thereon, the alloying composition of the respective films was identified by the same procedure as that for the first embodiment, and an evaluation was made on the four items, that is, crystallinity, adhesion property, hardness, and corrosion resistance, respectively. As a result, those determined as acceptable in overall evaluation are as shown in Table 6.

As is evident from Table 6, it was confirmed that the respective films are the hard layers 3 made of an amorphous alloy in the case of the target 4 being made of the following six different alloys, respectively. That is, in the case of the target 4 being made of an iron-cobalt-nickel-zirconium alloy (Fe—Co—Ni—Zr alloy), an iron-chromium-nickel-zirconium alloy (Fe—Cr—Ni—Zr alloy), an iron-cobalt-nickel-niobium zirconium alloy (Fe—Co—Ni—Nb—Zr alloy), an iron-cobalt-nickel-tantalum-zirconium alloy (Fe—Co—Ni—Ta—Zr alloy), an iron-cobalt-chromium-nickel-niobium-zirconium alloy (Fe—Co—Cr—Ni—Nb—Zr alloy), and an iron-cobalt-chromium-nickel-tantalum-zirconium alloy (Fe—Co—Cr—Ni—Ta—Zr alloy), respectively. Further, as a result of subjecting the respective films thus formed to the ICP-AES for identifying the alloying composition thereof, it was confirmed that any of the films was made of an alloy composed of those metals composing the target 4 and boron (B) contained in the mixed gas.

TABLE 6

| amorphous alloying composition (atomic %) | | | | | | | | crystallinity | adhesion property peeling starting load (gf) | hardness (Hv) | corrosion resistance corrosion | overall evaluation |
|---|---|---|---|---|---|---|---|---|---|---|---|---|
| Fe | Co | Cr | Ni | Nb | Ta | Zr | B | | | | | |
| 52 | 11 |  | 7 |  |  | 10 | 20 | amorphous | 440 | 620 | no | acceptable |
| 45 | 8 |  | 17 |  |  | 10 | 20 | amorphous | 450 | 640 | no | acceptable |
| 37 | 10 |  | 23 |  |  | 10 | 20 | amorphous | 490 | 730 | no | acceptable |
| 52 |  | 11 | 7 |  |  | 10 | 20 | amorphous | 440 | 600 | no | acceptable |
| 45 |  | 8 | 17 |  |  | 10 | 20 | amorphous | 430 | 590 | no | acceptable |

TABLE 6-continued

| amorphous alloying composition (atomic %) | | | | | | | | crystallinity | adhesion property peeling starting load (gf) | hardness (Hv) | corrosion resistance corrosion | overall evaluation |
|---|---|---|---|---|---|---|---|---|---|---|---|---|
| Fe | Co | Cr | Ni | Nb | Ta | Zr | B | | | | | |
| 37 |    | 10 | 23 |    |    | 10 | 20 | amorphous | 470 | 680 | no | acceptable |
| 56 | 7  |    | 7  | 2  |    | 8  | 20 | amorphous | 440 | 590 | no | acceptable |
| 45 | 8  |    | 17 | 2  |    | 8  | 20 | amorphous | 470 | 690 | no | acceptable |
| 56 | 7  |    | 7  |    | 2  | 8  | 20 | amorphous | 440 | 610 | no | acceptable |
| 45 | 8  |    | 17 |    | 2  | 8  | 20 | amorphous | 470 | 670 | no | acceptable |
| 50 | 7  | 6  | 7  | 2  |    | 8  | 20 | amorphous | 430 | 570 | no | acceptable |
| 50 | 7  | 6  | 7  |    | 2  | 8  | 20 | amorphous | 430 | 580 | no | acceptable |

Furthermore, it was confirmed based on the results of the X-ray diffraction that the crystallinity of the respective films was amorphous at least in the case of the composition ratio of respective metals composing the respective films being as described below. That is, in the case of an Fe—Co—Ni—Zr—B alloy having an approximate composition ratio of Fe:Co:Ni:Zr:B at 52:11:7:10:20, 45:8:17:10:20, and 37:10:23:10:20, by atomic %, respectively. In the case of an Fe—Cr—Ni—Zr—B alloy having an approximate composition ratio of Fe:Cr:Ni:Zr:B at 52:11:7:10:20, 45:8:17:10:20, and 37:10:23:10:20, by atomic %, respectively.

Further, in the case of an Fe—Co—Ni—Nb—Zr—B alloy having an approximate composition ratio of Fe:Co:Ni:Nb:Zr:B at 56:7:7:2:8:20, and 45:8:17:2:8:20, by atomic %, respectively. In the case of an Fe—Co—Ni—Ta—Zr—B alloy having an approximate composition ratio of Fe:Co:Ni:Ta:Zr:B at 56:7:7:2:8:20, and 45:8:17:2:8:20, by atomic %, respectively.

Still further, in the case of an Fe—Co—Cr—Ni—Nb—Zr—B alloy having an approximate composition ratio of Fe:Co:Cr:Ni:Nb:Zr:B at 50:7:6:7:2:8:20, by atomic %, and in the case of an Fe—Co—Cr—Ni—Ta—Zr—B alloy having an approximate composition ratio of Fe:Co:Cr:Ni:Ta:Zr:B at 50:7:6:7:2:8:20, by atomic %.

Further, the results of an evaluation made on respective items, such as adhesion property, and so on, are described as follows. More specifically, because a peeling starting load of the respective films was found at maximum 490 gf, and minimum 430 gf, being not less than 400 gf in any case, the adhesion property of the respective films was determined as acceptable. Still further, the surface hardness of the respective films was maximum Hv=730 of Vickers hardness, and minimum Hv=570, being not less than Hv=500 in any case, and was therefore determined as acceptable. Yet further, because no corrosion occurred to the respective films after the CASS testing, the corrosion resistance of the surface of the respective films was determined as acceptable. It was determined on the basis of the evaluations made as above that the respective soft metal articles 6 with the above-described hard layer 3 formed thereon, respectively, were acceptable as soft metal articles 5 in overall evaluation.

It is reasoned on the basis of the results described above that if a film contains boron (B) and iron (Fe), and the content of boron falls in a range of about 15 to 25 atomic %, the film is made of an amorphous alloy. Further, upon checking the alloying composition of the hard layer 3, any of the films was found containing Zr, and it was therefore reasoned that the films containing zirconium besides boron (B) and iron (Fe) was also the hard layer 3 made of an amorphous alloy.

Now, since iron is a magnetic element, it is reasoned that magnetic resistivity of a soft metal and a decorative article made thereof can be enhanced by forming the hard layer 3 containing iron thereon. In this connection, since any of Fe, Co, and Ni is a magnetic element, it is reasoned that magnetic resistivity of a soft metal and a decorative article made thereof can be enhanced in the case where the hard layer 3 containing Co or Ni or both besides iron is formed thereon. This point will be described in detail later.

EXAMPLE 2

Example 2 is similar to Example 1 except that a gas fed into a vacuum apparatus 100, and constituent materials of a soft metal article 6 and a target 4 differ from those for Example 1, and accordingly, description centering around points of difference will be given hereinafter, omitting or simplifying points common to both Examples 1 and 2.

With this Example, a soft metal article 6 made of a magnesium alloy (JIS specification: MC2A) is used, and for the target 4, use is made of alloys made of palladium (Pd) as its main constituent, with addition of a chip made of copper (Cu), as appropriate, such that elements Pd, and Cu are mixed with each other at optional composition ratios, respectively. As with the case of the first embodiment, an Ar gas plasma atmosphere is created in a vacuum apparatus 100, and atoms of metals composing the target 4 are sputtered inside the vacuum apparatus 100 by a sputtering method such as RF magnetron sputtering, and so forth so as to be deposited on the surface of the soft metal article 6, thereby forming an alloy layer 7. Subsequently, an Ar gas and a silane ($SiH_4$) gas are fed into the vacuum apparatus 100 and in such an atmosphere, the plasma of a mixed gas containing Ar and $SiH_4$ is caused to occur, thereby implementing surface modification of the alloy layer 7 by applying a plasma treatment thereto. The soft metal article 6 with the alloy layer 7 already formed thereon, which has been turned into the hard layer 3 made of an amorphous alloy containing silicon atoms contained in the mixed gas is designated as a soft metal article 5. With respect to the soft metal article 6, the alloying composition of respective films was identified by the same procedure as that for Example 1, and an evaluation was made on the four items, that is, crystallinity, adhesion property, hardness, and corrosion resistance, respectively. As a result, one determined as acceptable in overall evaluation is as shown in Table 7. In this connection, since feeding of a gas containing Si will suffice, a dichlorosilane ($SiH_2Cl_2$) gas may be fed in place of a silane ($SiH_4$) gas.

As shown in Table 7, any of the films is made of an palladium-copper-silicon alloy (Pd—Cu—Si alloy) composed of metals composing the target 4 and Si contained in the mixed gas. Further, it was confirmed based on the results of the X-ray diffraction that, at least in the case of a film made of the Pd—Cu—Si alloy having an approximate composition ratio of Pd:Cu:Si at 80:5:15, the film was a hard layer 3 which crystallinity is an amorphous alloy.

TABLE 7

| soft metal | alloying composition (atomic %) | | | | | crystallinity | adhesion property peeling starting load (gf) | hardness (Hv) | corrosion resistance corrosion | overall evaluation |
|---|---|---|---|---|---|---|---|---|---|---|
| | Au | Ge | Pd | Cu | Si | | | | | |
| AC2A | 80 | 12 | | | 8 | amorphous | 410 | 530 | no | acceptable |
| MC2A | | | 80 | 5 | 15 | amorphous | 410 | 520 | no | acceptable |

Still further, the results of evaluation made on respective items such as adhesion property, and so on are as described below. More specifically, because a peeling starting load of the film was found at 410 gf, not less than 400 gf, the adhesion property thereof was determined as acceptable. Then, the surface hardness of the film was Hv=520 of Vickers hardness, not less than Hv=500, and was therefore determined as acceptable. Yet further, because no corrosion occurred to the film after the CASS testing, the corrosion resistance of the surface of the film was determined as acceptable. Thus, it was determined on the basis of the evaluations made as above that the soft metal article 6 with the above described film formed thereon was acceptable as a soft metal articles 5 in overall evaluation.

Fourth Embodiment

Next, an embodiment of a decorative article and a method of producing the decorative article, according to the invention, are described hereinafter.

The decorative article according to the invention is obtained by working the soft metal into a soft metal article in a predetermined shape of the decorative article, and applying the method shown in the respective embodiments described above to the soft metal article, thereby forming a hard layer made of an amorphous alloy on the surface thereof. With the present embodiment, decorative articles of wristwatch are described hereinafter by way of example of the decorative article.

EXAMPLE 1

Figure 4:
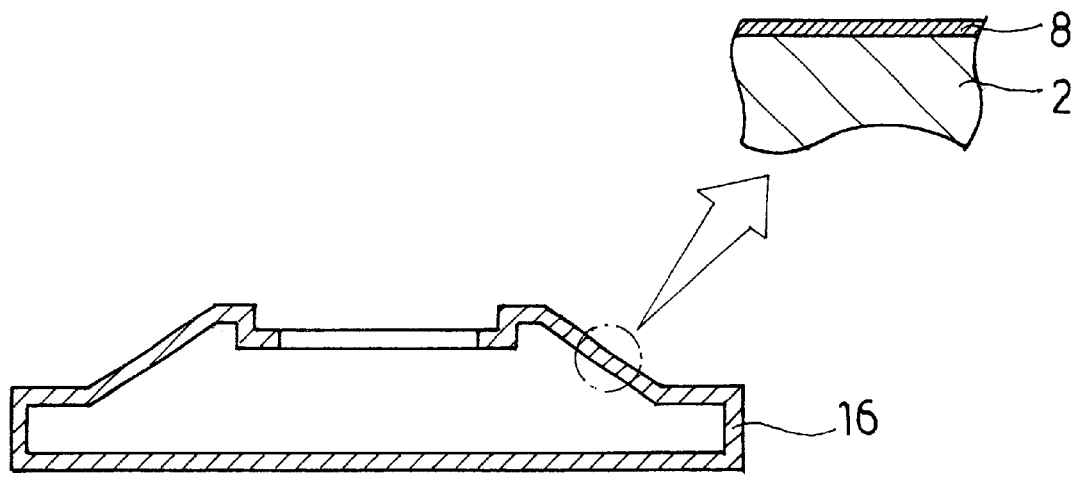
FIG. 4 shows a schematic sectional view of a decorative article of wristwatch with an amorphous alloy film formed thereon, and a schematic sectional view of the enlarged principal part thereof.

First, a wristwatch case 16, shown in FIG. 4, with a hard layer 8 made of an amorphous alloy, formed on the surface thereof, is described as an example of the decorative articles of wristwatch. The decorative articles of wristwatch include wristwatch bezel, wristwatch case back, wristwatch band, clasp, crown, and so forth besides the wristwatch case, and the hard layer 8 made of an amorphous alloy can be formed on these components as well in the same way as for the wristwatch case 16 described hereinafter.

The wristwatch case 16 according to this embodiment is produced by sputtered atoms of metals composing a target from the target in the plasma of a mixed gas containing an inert gas and a non-metallic element or a metalloid element, thereby forming the hard layer 8, made of an amorphous alloy. More specifically, the wristwatch case 16 is produced as follows. Prepared first is a wristwatch case made of brass, with the surface thereof, finished in a highly mirror polished surface by applying a pretreatment of buffing and barrel polishing thereto. The wristwatch case and a target 4 are disposed inside a vacuum apparatus 100, the vacuum apparatus 100 is subsequently evacuating it through a pump 101, and thereafter, an argon (Ar) gas is fed therein to thereby cause a plasma to occur. Subsequently, a diborane ($B_2H_6$) gas is fed into the vacuum apparatus 100 and an internal pressure thereof is maintained at $5 \times 10^{-3}$ Torr. Then, using the target 4 made of alloys composed of iron (Fe) as its main constituent, with addition, as appropriate, of chips made of elements, cobalt (Co), nickel (Ni), and zirconium (Zr), respectively, such that the elements are mixed with each other at optional composition ratios, atoms of respective metals are sputtered by a sputtering method such as the DC sputtering method, and so forth in the plasma atmosphere of a mixed gas containing an Ar gas and a $B_2H_6$ gas, and the atoms of the respective metals and atoms (boron) contained in the mixed gas are caused to be deposited on the surface of the wristwatch case, thereby forming a film made of an Fe—Co—Ni—Zr—B alloy. By forming the film such that the alloying composition thereof has the same composition ratios of the respective elements as those shown in the third embodiment previously described, the wristwatch case 16 having the hard layer 8 made of an amorphous alloy can be produced. Thereafter, a timepiece is completed by assembling a timepiece module component (not shown) into the wristwatch case 16.

With a timepiece comprising the wristwatch case 16 produced as above, evaluations were made on mirror polished surface and magnetic resistivity as well in addition to those items on which evaluations were made with respect to the soft metal article 5 previously described, and the results of such evaluations are as shown in Table 8. In this case, whether or not mirror polished surface prior to the formation of the hard layer 8 remains intact was determined by visual check of an outside appearance of the wristwatch case 16, thereby making an evaluation on mirror polished surface as acceptable in the case of the mirror polished surface remaining intact. Meanwhile, the timepiece fabricated by use of the wristwatch case 16 was placed in a magnetic field of 60 gauss for five minutes, making an evaluation on magnetic resistivity as acceptable in the case where none of the hour hand, minute hand, and second hand of the timepiece was delayed or stopped. Then, an evaluation was made such that those evaluated as acceptable on all six items in total, including the four items on which evaluations were previously made with respect to the soft metal article 5, the mirror polished surface, and the magnetic resistivity, were determined as acceptable in the overall evaluation. The results of the evaluation are as shown in Table 8.

TABLE 8

| soft metal | alloying composition (atomic %) | | | | | | crystallinity | adhesion property peeling starting load (gf) | hardness (Hv) | corrosion resistance | mirror polished surface visual check | magnetic resistance delay or stop | overall evaluation |
|---|---|---|---|---|---|---|---|---|---|---|---|---|---|
| | Fe | Co | Ni | Nb | Zr | B | | | | | | | |
| brass | 52 | 11 | 7 | | 10 | 20 | amorphous | 440 | 620 | no | mirror | no | acceptable |
| Ti | 45 | 8 | 17 | 2 | 8 | 20 | amorphous | 470 | 690 | no | mirror | no | acceptable |

The film was subjected to the ICP-AES for identifying the alloying composition thereof, whereupon it was confirmed as shown in Table 8 that the hard layer 8 had an approximate composition ratio of Fe:Co:Ni:Zr:B at 52:11:7:10:20 by atomic %, and was made of an alloy having amorphous crystallinity according to the results of the X-ray diffraction, determining the same as acceptable. Because a peeling starting load of the film was found at 440 gf, not less than 400 gf, the adhesion property thereof was determined as acceptable while the surface hardness of the film was Hv=620 of Vickers hardness, not less than Hv=500, and was therefore determined as acceptable. Because no corrosion occurred to the film after the CASS testing, the corrosion resistance thereof as well was determined as acceptable. Furthermore, because the mirror polished surface prior to the formation of the hard layer 8 remained intact, the mirror polished surface as well was determined as acceptable, and the magnetic resistivity as well was determined as acceptable because none of the hour hand, minute hand, and second hand of the timepiece was delayed or stopped even when the timepiece fabricated by use of the wristwatch case 16 was placed in a magnetic field of 60 gauss for five minutes. Based on those evaluations as described above, the wristwatch case 16 with the hard layer 8 formed thereon was determined as acceptable in overall evaluation.

Thus, as a result of the formation of the film containing Fe, Co, and Ni which are magnetic elements, the wristwatch case 16 is provided with a new function of magnetic resistivity in addition to the operation effects of the hard layer 8, that is, high hardness, high corrosion resistance, and high mirror polished surface. Accordingly, the wristwatch case according to the invention is provided with an additional merit in that the need for disposing a sheet having magnetic resistivity inside a timepiece module as required in the case of a conventional wristwatch case can be eliminated.

EXAMPLE 2

With a wristwatch case 16 according to this example, a hard layer 8 of a different composition is formed by a method differing from that for Example 1, however, both Examples 1 and 2 have parts in common except the hard layer 8. Accordingly, description centering around points of difference will be given hereinafter, omitting or simplifying points common to both Examples 1 and 2.

The wristwatch case 16 according to this embodiment is produced as follows. First, atoms of metals composing a target are sputtered in an inert gas plasma, and an alloy layer is formed by deposition of the atoms of the metals. Subsequently, surface modification of the alloy layer thus formed is implemented by applying a plasma treatment thereto in the plasma of a mixed gas containing the inert gas and a non-metallic element or a metalloid element, and the alloy layer is turned into the hard layer 8 made of an amorphous alloy containing atoms contained in the mixed gas, thereby producing the wristwatch case 16. More specifically, the wristwatch case 16 is produced by the following method. Details of the method are the same as those for the third embodiment previously described.

First, a wristwatch case made of titanium (Ti) with a pre-polishing applied thereto by the same procedure as that for Example 1 is prepared. The wristwatch case and a target 4 are disposed inside a vacuum apparatus 100, and the vacuum apparatus 100 is subsequently evacuating it through a pump 101. Thereafter, an argon (Ar) gas is fed therein to thereby cause a plasma to occur while maintaining an internal pressure of the vacuum apparatus 100 at $5 \times 10^{-3}$ Torr. Subsequently, atoms of metals composing the target 4 are sputtered in an Ar gas plasma atmosphere by a sputtering method such as the DC sputtering method, and so forth, thereby forming an alloy layer on the surface of the wristwatch case. Thereafter, a diborane ($B_2H_6$) gas is fed into the vacuum apparatus 100 and the internal pressure of the vacuum apparatus 100 is maintained at $5 \times 10^{-3}$ Torr. Then, in that atmosphere, the plasma of a mixed gas containing Ar and $B_2H_6$ is caused to occur, and surface modification of the alloy layer already formed is implemented in the plasma of the mixed gas by applying a plasma treatment thereto, thereby forming the hard layer 8 made of an amorphous alloy containing boron atoms contained in the mixed gas. The wristwatch case 16 is produced in this way and a timepiece is completed by a assembling timepiece module component into the wristwatch case 16.

The target 4 used in this case is made of an alloy composed of iron (Fe) as its main constituent, with addition, as appropriate, of chips made of elements, cobalt (Co), nickel (Ni), niobium (Nb), and zirconium (Zr), respectively, such that the elements Fe, Co, Ni, Nb, and Zr are mixed with each other at optional composition ratios. As a result of using the target 4, there is formed a film made of an Fe—Co—Ni—Nb—Zr—B alloy on the surface of the wristwatch case. Upon evaluating the alloying composition and crystallinity of the film according to the same procedure as that for Example 1, it was confirmed that the film was the hard layer 8 made of an amorphous alloy having an approximate composition ratio of Fe:Co:Ni:Nb:Zr:B at 45:8:17:2:8:20 by atomic %. Further, an evaluation was made on the four respective items, that is, adhesion property, hardness, corrosion resistance, mirror polished surface, and magnetic resistivity, respectively, by the same procedure as that for Example 1, whereupon it was found that the results of the evaluations were as shown in Table 8. As shown in Table 8, because a peeling starting load of the film was found at 470 gf, not less than 400 gf, the adhesion property thereof was determined as acceptable, and because the surface hardness of the film was Hv=690 of Vickers hardness, not less than Hv=500, the surface hardness thereof was determined as acceptable. As with Example 1, the corrosion resistance, mirror polished surface, and magnetic resistivity of the film were also determined as acceptable as a result of evaluation made thereon. Accordingly, with Example 2 as well, the wristwatch case 16 with the abovedescribed hard layer 8 formed thereon was determined as acceptable in overall evaluation.

EXAMPLE 3

With this Example, use is made of a wristwatch case made of titanium (Ti) with a pre-polishing applied thereto by the same procedure as that for Example 2, and for a target 4, use is made of an cobalt-niobium-titanium alloy having a composition ratio of Co:Nb:Ti at 85:10:5 by atomic %. The wristwatch case and the target 4 are disposed in a vacuum apparatus 100, and by use of a sputtering method such as the DC sputtering method, and so forth according to the same procedure as for Example 1, atoms of metals composing the target 4 are sputtered, thereby forming a film made of an amorphous alloy having an approximate composition ratio of Co:Nb:Ti at 85:10:5 by atomic % on the surface of the wristwatch case. A wristwatch case 16 is produced in this way. Thereafter, a timepiece is completed by assembling a timepiece module component into the wristwatch case 16.

With a timepiece comprising the wristwatch case 16 produced as above, an evaluation was made on respective items, that is, adhesion property, hardness, corrosion resistance, mirror polished surface, and magnetic resistivity by the same procedure as that for Example 1, whereupon it was found that the results of the evaluations were as follows. Because a peeling starting load of the film was found at 450 gf, not less than 400 gf, the adhesion property thereof was determined as acceptable, and because the surface hardness of the film was Hv=550 of Vickers hardness, not less than Hv=500, the surface hardness was determined as acceptable. As with Example 1, the corrosion resistance, mirror polished surface, and magnetic resistivity of the film were also determined as acceptable. Accordingly, with Example 3 as well, the wristwatch case 16 was determined as acceptable in overall evaluation.

EXAMPLE 4

Figure 8:
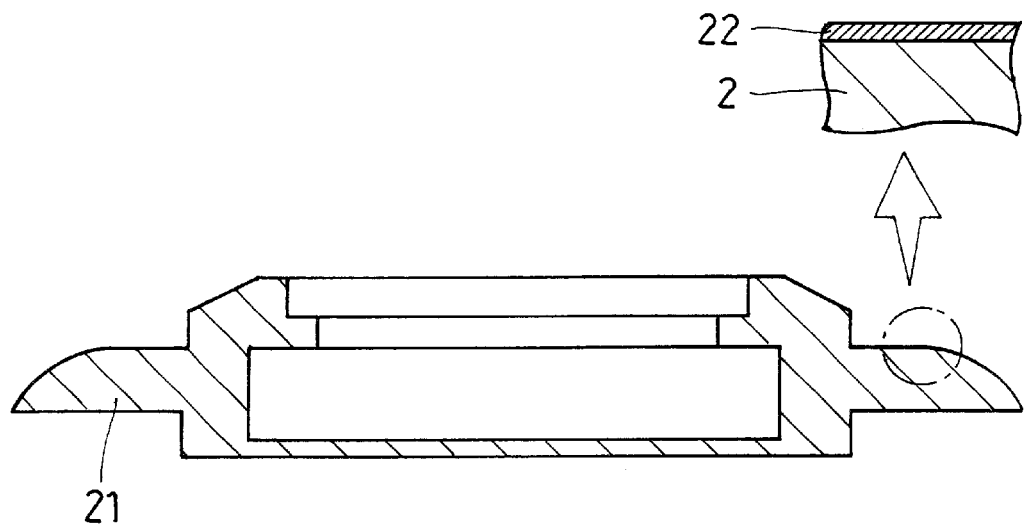
FIG. 8 shows a schematic sectional view of a wristwatch case as an example of a decorative article of wristwatch, and a schematic sectional view of the enlarged principal part thereof.

With Example 4, use is made of a wristwatch case 21 of a structure shown in FIG. 8 as another example of the decorative article of wristwatch. Otherwise, Example 4 is substantially the same as Example 1 as compared therewith except that a target 4 is differs in respect of constituent material, and accordingly, description centering around points of difference will be given hereinafter, omitting or simplifying points common to both Examples 1 and 4.

The wristwatch case 21 is formed of stainless steel (SUS304) as a constituent material, and the surface thereof is finished in a highly mirror polished condition by applying a pre-polishing thereto. The target 4 is worked into a disk 6 inches in diameter, and about 20 mm in thickness, made of an Fe—Co—Ni—Zr—B alloy having an approximate composition ratio of Fe:Co:Ni:Zr:B at 56:7:7:10:20 by atomic %.

With the use of the target 4, a film 22 in the order of 2 $\mu$m in thickness was formed on the surface of the wristwatch case 21 by the same method as that for Example 1, and further, a timepiece module was assembled into the wristwatch case 21, thereby completing a timepiece. The alloying composition and crystallinity of the film 22 were checked by the same procedure as that for Example 1, whereupon it was confirmed that the film 22 was a film made of an iron-based amorphous alloy. The film 22 was formed on the following conditions.

pressure of an argon gas to be fed: $2\times10^{-2}$ Torr
bias voltage: −500 V
substrate temperature: 200° C.
sputtering time: 130 minutes With respect of the timepiece comprising the wristwatch case 21, the results of an evaluation made on respective items of surface hardness, corrosion resistance, and magnetic resistivity by the same procedure as for that Example 1 were found as follows. That is, the surface hardness was found as acceptable because the surface hardness was at Hv=1290 of Vickers hardness, and the corrosion resistance of the surface thereof was found quite excellent because no initiation of rust occurred to the surface even after the timepiece was subjected to a salt spray test (SST) in accordance with JIS2371 for 96 hours.

Meanwhile, in the case of assembling a timepiece module into a conventional wristwatch case made of stainless steel (SUS304), magnetic resistivity thereof was found at 40 Oe at the maximum (a timepiece does not stop if it is in a magnetic field of not more than 40 Oe, however, there is the risk of the timepiece coming to stoppage in a magnetic field of 40 Oe or more). In the case of assembling a timepiece module into the wristwatch case according to the invention, magnetic resistivity thereof is enhanced to 60 Oe. In this case, for the timepiece module, a module for a crystal timepiece of a step motor converter type was adopted.

Thus, by forming the film 22 made of the iron-based amorphous alloy on the wristwatch case formed of stainless steel (SUS304), it becomes possible to implement production of a wristwatch case high in surface hardness, and excellent in magnetic resistivity as well as corrosion resistance.

EXAMPLE 5

Figure 9:
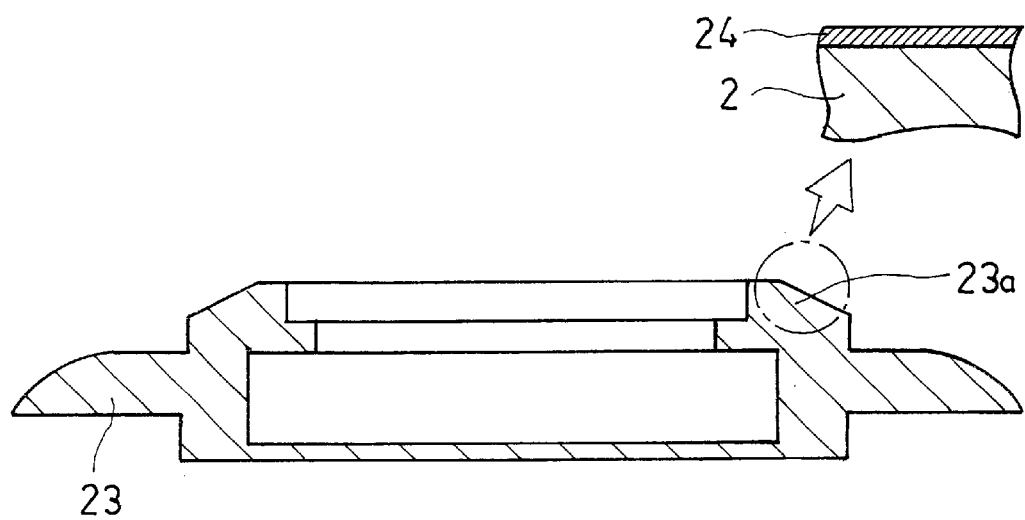
FIG. 9 shows a schematic sectional view of a wristwatch case different from the wristwatch case shown in FIG. 8, and a schematic sectional view of the enlarged principal part thereof.

With Example 5, use is made of a wristwatch case 23 of a structure shown in FIG. 9. The wristwatch case 23 is similar in structure to the wristwatch case 21, but differs therefrom in that the wristwatch case 23 is formed of titanium as a constituent material. A target 4 is made of an Fe—Co—Ni—Zr—Nb—B alloy having a composition ratio of Fe:Co:Ni:Zr:Nb:B at 56:7:7:8:2:20 by atomic %.

With the use of the target 4, a film 24 in the order of 1.5 $\mu$m in thickness was formed on the surface of a wristwatch bezel 23a of the wristwatch case 23 by the same method as that for Example 1, and further, a timepiece module was assembled into the wristwatch case 23, thereby completing a timepiece. The alloying composition and crystallinity of the film 24 were checked by the same procedure as that for Example 1, whereupon it was confirmed that the film 24 was a film made of an iron-based amorphous alloy. The film 24 was formed on the same conditions as those for Example 1 except that an argon gas was fed at a pressure of $3\times10^{-2}$ Torr, and sputtering time of 90 minutes was adopted.

With respect to the wristwatch case 23 produced on the conditions described above, the results of an evaluation made on respective items of hardness, corrosion resistance, and magnetic resistivity were as follows. That is, hardness was found as acceptable because the hardness was at Hv=1260 of Vickers hardness, and corrosion resistance was found quite excellent because no initiation of rust occurred to the surface thereof as with the case of Example 1. Further, it was confirmed that magnetic resistivity thereof was enhanced to 60 Oe as with the case of Example 1. Accordingly, even by forming a film made of an iron-based amorphous alloy on the wristwatch bezel of a wristwatch case formed of titanium, it becomes possible to implement production of the wristwatch case high in surface hardness, and excellent in magnetic resistivity as well as corrosion resistance.

EXAMPLE 6

Figure 10:
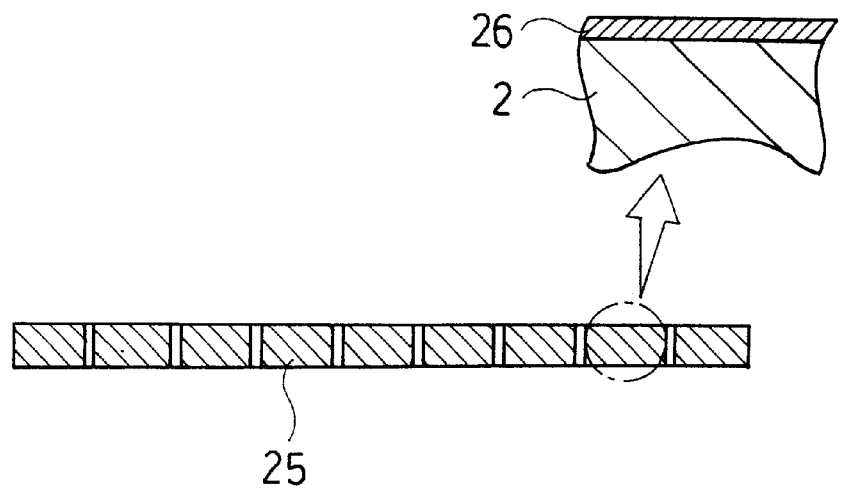
FIG. 10 shows a schematic sectional view of a wristwatch band as another example of the decorative article of wristwatch, and a schematic sectional view of the enlarged principal part thereof.

With Example 6, use is made of a wristwatch band 25 shown in FIG. 10 as another decorative article of wristwatch. The wristwatch band 25 is formed of stainless steel (SUS304) as a constituent material, and the surface thereof is finished in a highly mirror polished condition by applying a pre-polishing thereto. A target 4 is made of an Fe—Co—Ni—Zr—Ta—B alloy having an approximate composition ratio of Fe:Co:Ni:Zr:Ta:B at 56:7:7:8:2:20 by atomic %.

With the use of the target 4, a film 26 in the order of 2 μm in thickness was formed on the surface of the wristwatch band 25 by the same method as that for Example 1. The alloying composition and crystallinity of the film 26 were checked by the same procedure as that for Example 1, whereupon it was confirmed that the film 26 was a film made of an iron-based amorphous alloy. The film 26 was formed on the same conditions as those for Example 1.

With respect to the wristwatch band 25 with the film 26 formed thereon under the conditions described above, the results of an evaluation made on respective items of hardness, and corrosion resistance were as follows. That is, the hardness was found at Hv=1250 of Vickers hardness, and was therefore determined as acceptable while the corrosion resistance was found quite excellent because no initiation of rust occurred to the film 26 after the wristwatch band 25 was subjected to a salt spray test (SST) in accordance with JIS2371 for 96 hours. Further, upon connecting a signal receiving circuit (not shown) to the wristwatch band 25, it was confirmed that the surface of the wristwatch band 25, with the film 26 formed thereon, can satisfactorily function as a receiving antenna of a radio watch.

Thus, by forming the film 26 made of the iron-based amorphous alloy on the wristwatch band formed of stainless steel (SUS304) by a sputtering method, it becomes possible to implement production of the wristwatch band high in surface hardness, and excellent in corrosion resistance, capable of satisfactorily functioning as the receiving antenna of the radio watch.

Fifth Embodiment

Next, another embodiment of a decorative article and a method of producing the decorative article, according to the invention, are described hereinafter. With this embodiment, decorative articles of wristwatch are described hereinafter by way of example of the decorative article as with the fourth embodiment.

EXAMPLE 1

Figure 11:
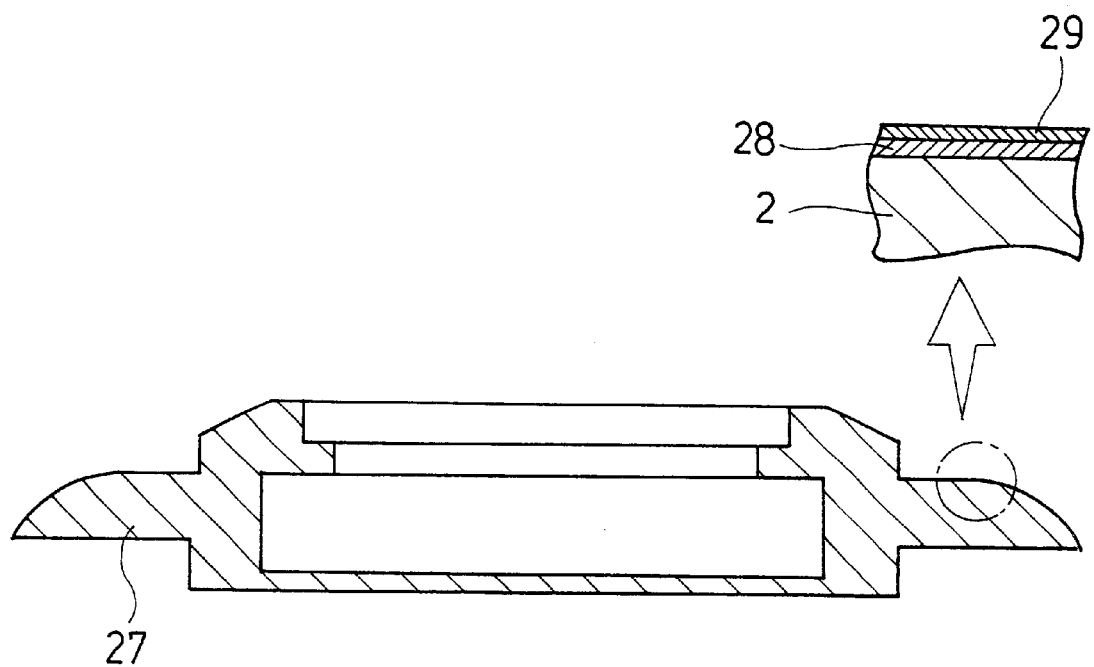
FIG. 11 shows a schematic sectional view of a wristwatch case with an amorphous alloy film, formed on the surface thereof, through the intermediary of an intermediate layer, and a schematic sectional view of the enlarged principal part thereof.

First, a wristwatch case 27 shown in FIG. 11 is described. The wristwatch case 27 is the same in structure as the wristwatch case 21 previously described, but is provided with a hard layer 29 made of an amorphous alloy, formed on the surface thereof by the multi-cathodic ion-electroplating method using an evaporation source composed of predetermined metals.

The wristwatch case 27 is formed of brass as a constituent material, and a nickel electroplating film 28 in the order of 50 μm in thickness, to serve as an intermediate layer, is formed on the surface thereof beforehand. The nickel electroplating film 28 is formed by electroplating but may be formed by PVD (physical vapor deposition) or CVD (chemical vapor deposition) instead. Further, as the constituent material of the film 28, use may be made of a nickel alloy, such as nickel-phosphorus alloy, nickel-boron alloy, and so forth, in place of nickel, and titanium, chromium, or stainless steel may be used instead.

Use is made of the evaporation source which has been worked into a disk 40 mm in diameter and 30 mm in thickness, and is made of an Fe—Zr—B alloy having a composition ratio of Fe:Zr:B at 70:10:20 by atomic %.

Then, metals composing the evaporation source are ionized in an argon gas, and ions of the metals are deposited on the film 28, thereby forming a film 29 in the order of 3 μm in thickness. The alloying composition and crystallinity of the film 29 were checked by the same procedure as that for the fourth embodiment of the invention, whereupon it was confirmed that the film 29 was a film made of an iron-based amorphous alloy. The film 29 was formed on the following conditions.

pressure of an argon gas to be fed: $7 \times 10^{-3}$ Torr
cathode bias voltage: −200 V
sub cathode bias voltage: −200 V
filament current: 36 A
substrate temperature: 150° C.
ion-electroplating time: 50 minutes With respect to the wristwatch case 27 with the film 29 formed thereon under the conditions described above, the results of an evaluation made on respective items of hardness, corrosion resistance, and magnetic resistivity were as follows. That is, the hardness was found at Hv=1070 of Vickers hardness, and was therefore determined as acceptable, and corrosion resistance was found quite excellent because no initiation of rust occurred to the surface of the wristwatch case 27 after the wristwatch case 27 was subjected to a salt spray test (SST) in accordance with JIS2371 for 96 hours.

In addition, there was produced the wristwatch case 27 wherein a film (not shown) of gold electroplating, about 2 μm in thickness, was formed on the surface of the film 28, and subsequently, the film 29 made of the iron-based amorphous alloy was formed on top of the film of gold electroplating. Upon checking magnetic resistivity of a timepiece using the wristwatch case 27, it was confirmed that magnetic resistivity of the timepiece as well was enhanced to 60 Oe.

Thus, by forming a hard layer made of an amorphous alloy by the multi-cathodic ion-electroplating method on a wristwatch case formed of brass, it becomes possible to implement production of the wristwatch case high in surface hardness, and excellent in magnetic resistivity as well as corrosion resistance.

EXAMPLE 2

Figure 12:
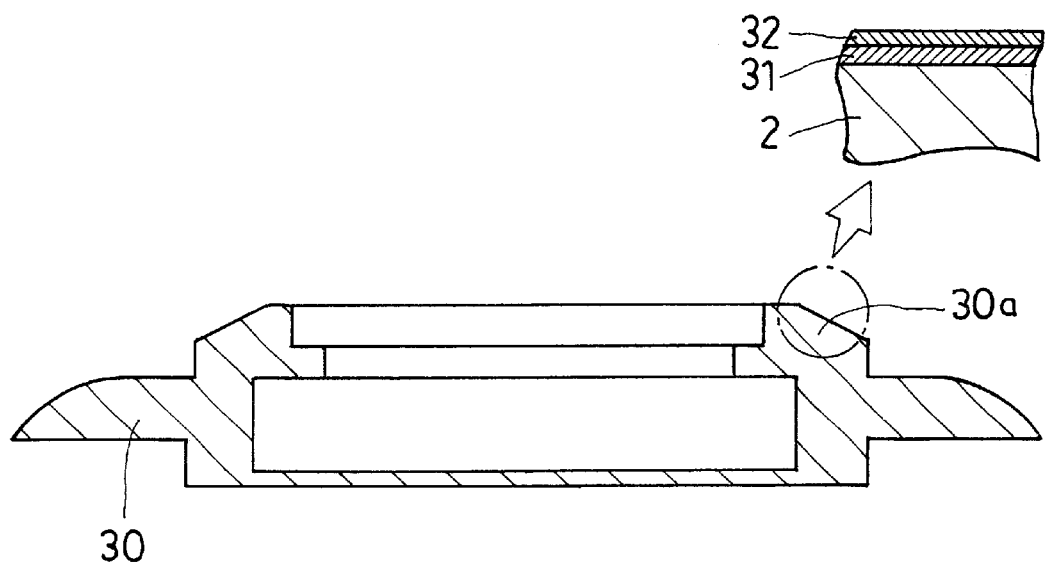
FIG. 12 shows a schematic sectional view of another wristwatch case with an amorphous alloy film, formed on the surface thereof, through the intermediary of an intermediate layer, and a schematic sectional view of the enlarged principal part thereof.

With Example 2, use is made of a wristwatch case 30 shown in FIG. 12. The wristwatch case 30 is the same in structure as the wristwatch case 21, but differs from in that the wristwatch case 30 is formed of zinc as a constituent material. Use is made of the same evaporation source as that for Example 1. Further, a film 31 in the order of 70 μm in thickness, to serve as an intermediate layer, was first formed on the surface of the wristwatch case 30 by the same procedure as that for Example 1.

Subsequently, a film 32 in the order of 2 μm in thickness was formed on the surface of a wristwatch bezel 30a of the wristwatch case 30 by the same procedure as that for Example 1. The alloying composition and crystallinity of the film 32 were checked by the same procedure as that for Example 1, whereupon it was confirmed that the film 32 was a film made of an iron-based amorphous alloy. The film 32 was formed on the following conditions.

pressure of an argon gas to be fed: $5 \times 10^{-3}$ Torr
cathode bias voltage: −250 V
sub cathode bias voltage: −250 V
filament current: 52 A
substrate temperature: 150° C.
ion-electroplating time: 35 minutes With respect to the wristwatch case 30 with the film 32 formed thereon under the conditions described above, the results of an evaluation made on respective items of hardness, corrosion resistance, and magnetic resistivity were as follows. That is, the hardness was found at Hv=1050 of Vickers hardness, and was therefore determined as acceptable, while the corrosion resistance was found quite excellent because no initiation of rust occurred to the surface of the wristwatch case 30 upon testing the same by the same method as that used for Example 1. In addition, there was produced the wristwatch case 30 wherein a film (not shown) of gold electroplating, was formed on the surface of the film 31, and subsequently, the film 32 made of the iron-based amorphous alloy was formed on top of the film of gold electroplating. Upon checking magnetic resistivity of a timepiece using the wristwatch case 30, it was confirmed that magnetic resistivity of the timepiece as well was enhanced to 60 Oe.

Thus, by forming a hard layer made of an amorphous alloy by the multi-cathodic ion-electroplating method on the wristwatch bezel of a wristwatch case made of zinc, it becomes possible to implement production of the wristwatch case high in surface hardness, and excellent in magnetic resistivity as well as corrosion resistance.

Sixth Embodiment

Next, still another embodiment of a decorative article and a method of producing the decorative article, according to the invention, are described hereinafter.

Figure 13:
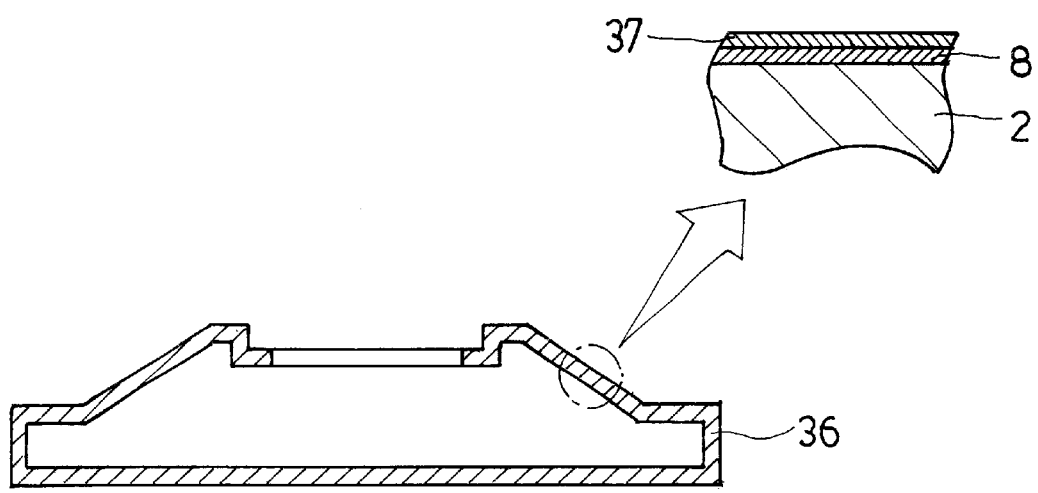
FIG. 13 shows a sectional view of a wristwatch case of the same structure as shown in FIG. 4, with an amorphous alloy film and a noble metal layer, formed on the surface thereof, and a schematic sectional view of the enlarged principal part thereof.

In this case, the same wristwatch case made of titanium (Ti) as was used in Example 2 of the fourth embodiment of the invention is used, and on the surface thereof, a hard layer 8 made of an amorphous alloy, and a noble metal layer 37 are formed by a method described hereinafter, thereby producing a wristwatch case 36. FIG. 13 shows a sectional view of the wristwatch case 36 and a sectional view of the enlarged principal part thereof. The present embodiment is characterized in that decorative quality is enhanced by the formation of the noble metal layer 37, and a more preferable decorative article can be obtained. As with the fifth embodiment of the invention, a timepiece is completed by assembling a timepiece module component into the wristwatch case 36.

By the same method as that for the first embodiment of the invention, the wristwatch case made of titanium and a target 4 are disposed in an argon gas plasma atmosphere, and atoms of metals composing the target 4 made of a Co—Nb—Zr alloy are deposited on the surface of the wristwatch case made of titanium by the DC sputtering method, thereby forming a hard layer 8. Subsequently to the formation of the hard layer 8, a pressure inside a vacuum apparatus 100 is maintained in the order of $5 \times 10^{-3}$ Torr, and the noble metal layer 37 composed of Pd or Pt is formed in the argon gas plasma atmosphere so as to overlie the hard layer 8 by the DC sputtering method using a target 4 made of palladium (Pd) or platinum (Pt), thereby forming the wristwatch case 36. Thereafter, the alloying composition of the hard layer 8 and the noble metal layer 37, respectively, was identified by the same procedure as previously described, and an evaluation was made on four items, that is, crystallinity, adhesion property, hardness, and corrosion resistance, respectively. As a result, it was determined that four different samples shown in Table 9 were acceptable in overall evaluation.

It was confirmed based on the results of the X-ray diffraction that at least in the case of films as formed having an approximate composition ratio of Co:Nb:Zr at 55:30:15, 65:20:15, 75:10:15, and 80:10:10, by atomic %, the films including the hard layer 8 and the noble metal layer 37 were made of an amorphous alloy.

TABLE 9

| alloying composition (atomic %) | | | noble metal layer | crystallinity | adhesion property peeling starting load (gf) | hardness (Hv) | corrosion resistance corrosion | overall evaluation |
|---|---|---|---|---|---|---|---|---|
| Co | Nb | Zr | | | | | | |
| 55 | 30 | 15 | Pd | amorphous | 400 | 530 | no | acceptable |
| 65 | 20 | 15 | Pd | amorphous | 500 | 600 | no | acceptable |
| 75 | 10 | 15 | Pt | amorphous | 500 | 600 | no | acceptable |
| 80 | 10 | 10 | Pt | amorphous | 550 | 630 | no | acceptable |

Further, the results of an evaluation made on respective items, such as adhesion property and so on, are as described below. Because a peeling starting load of the respective films was found at maximum 550 gf, and minimum 400 gf, being not less than 400 gf in any case while the surface hardness thereof was at maximum Hv=630 of Vickers hardness, and minimum Hv=530 or more, both the adhesion property and the surface hardness thereof were determined as acceptable. Still further, the corrosion resistance thereof was also determined as acceptable as with the case of the first embodiment. Accordingly, it was determined that the wristwatch case 36 with the hard layer 8 and the noble metal layer 37 formed thereon was acceptable in overall evaluation.

Seventh Embodiment

Figure 14:
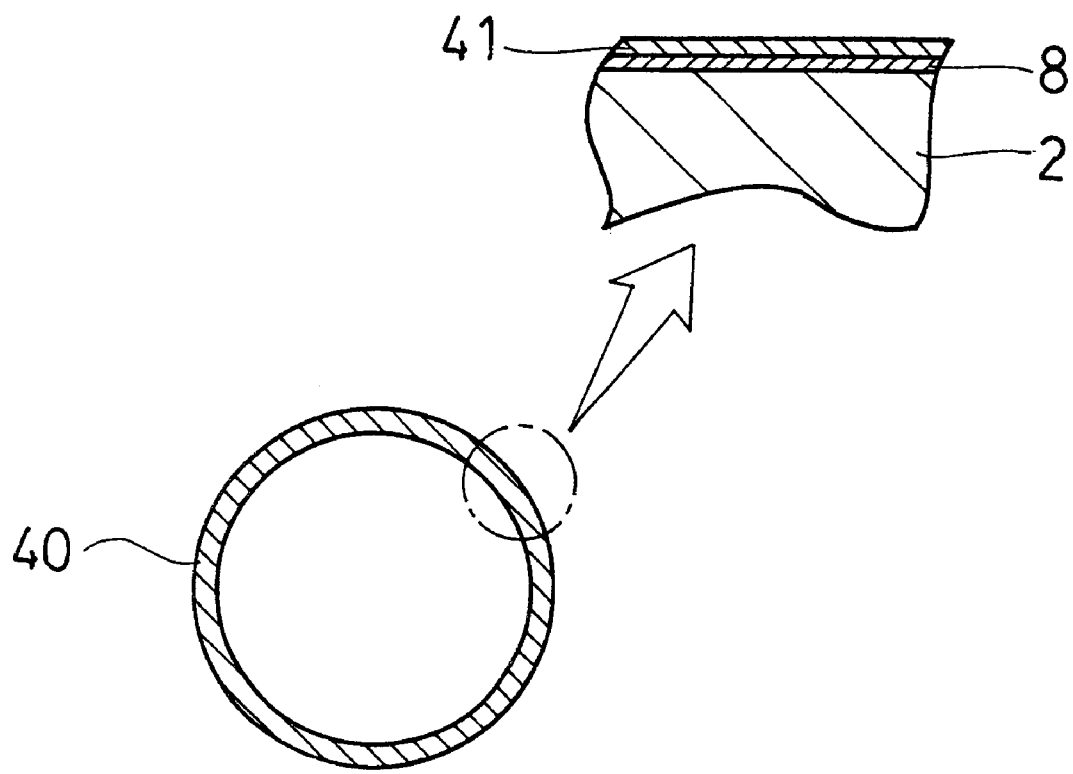
FIG. 14 shows a sectional view of a ring with an amorphous alloy film and a noble metal layer, formed on the surface thereof, and a schematic sectional view of the enlarged principal part thereof.

Next, yet another embodiment of a decorative article according to the invention is described hereinafter. With this embodiment, a ring 40 shown in FIG. 14 is described.

For the ring 40, there is prepared a ring made of titaniun (Ti) with the surface finished in a highly mirror polished condition by applying thereto the same polishing pretreatment as applied in Example 1 of the previously described fourth embodiment of the invention. Then, a hard layer 8 made of an amorphous alloy is formed on the entire surface thereof, and a noble metal layer 41 is further formed so as to overlie the hard layer 8, thereby producing preferable decorative articles having high decorative quality. The ring 40 is produced as follows.

First, the ring made of titanium and a target made of a Co—Nb—Zr alloy are disposed inside a vacuum apparatus 100, and atoms of metals composing the target are deposited on the surface of the ring by a sputtering method in an argon gas plasma atmosphere, thereby forming the hard layer 8 thereon. Subsequently to the formation of the hard layer 8, a pressure inside the vacuum apparatus 100 is maintained in the order of $5 \times 10^{-3}$ Torr, and the noble metal layer 41 composed of Pd or Pt is formed so as to overlie the hard layer 8 by the ion electroplating method whereby palladium (Pd) or platinum (Pt) is evaporated in the argon gas plasma atmosphere. Thereafter, the alloying composition of the hard layer 8 and the noble metal layer 41, respectively, was identified by the same procedure as that for the sixth embodiment of the invention, and an evaluation was made on four items, that is, crystallinity, adhesion property, hardness, and corrosion resistance, respectively, whereupon it was determined that four different samples shown in Table 10 were acceptable in overall evaluation.

Further, it was confirmed based on the results of the X-ray diffraction that at least in the case of films as formed having four different approximate composition ratios of Co:Nb:Zr at 55:30:15, 65:20:15, 75:10:15, and 80:10:10, by atomic %, the films including the hard layer 8 and the noble metal layer 41 were made of an amorphous alloy.

TABLE 10

| alloying composition (atomic %) | | | noble metal layer | crystallinity | adhesion property peeling starting load (gf) | hardness (Hv) | corrosion resistance corrosion | overall evaluation |
|---|---|---|---|---|---|---|---|---|
| Co | Nb | Zr | | | | | | |
| 55 | 30 | 15 | Pt | amorphous | 400 | 550 | no | acceptable |
| 65 | 20 | 15 | Pt | amorphous | 500 | 600 | no | acceptable |
| 75 | 10 | 15 | Pd | amorphous | 500 | 610 | no | acceptable |
| 80 | 10 | 10 | Pd | amorphous | 550 | 650 | no | acceptable |

Still further, the results of an evaluation made on respective items, such as adhesion property and so on, are as described below. Because a peeling starting load of the respective films was found at maximum 550 gf, and minimum 400 gf, being not less than 400 gf in any case while the surface hardness thereof was at maximum Hv=650 of Vickers hardness, and minimum Hv=550 or more, being not less than Hv=500 in any case, both the adhesion property and the surface hardness thereof were determined as acceptable. Furthermore, the corrosion resistance thereof was also determined as acceptable as with the case of the sixth embodiment. Accordingly, it was determined that the ring 40 with the hard layer 8 and the noble metal layer 41 formed thereon was acceptable in overall evaluation.

With the respective embodiments described hereinbefore, excluding one embodiment (the fifth embodiment), the hard layer made of an amorphous alloy is formed directly on the surface of a soft metal article or a decorative article, however, the hard layer made of the amorphous alloy may be formed as necessary after an intermediate layer such as a nickel electroplating layer, and so forth is formed.

With the sixth and seventh embodiments, Pd or Pt is used in forming the noble metal layer, however, instead of these elements, use may be made of an element selected from the group consisting of six elements, that is, gold (Au), silver (Ag), iridium (Ir), osmium (Os), ruthenium (Ru), and rhodium (Rh), or a mixture or an alloy of at least more than one element selected from the group consisting of the six elements and palladium (Pd) and platinum (Pt).

The invention can be applied to decorative articles such as the frame of eyeglasses, a pendant, pierced earring, earring, brooch, bracelet, necklace, tie-pin, button, cuff links, anklet, and so forth, besides the decorative articles of wristwatch such as a wristwatch case, and so forth.

As for the condition under which the hard layer made of an amorphous alloy is formed, not only the pressure in the gas plasma atmosphere as indicated with reference to the respective embodiments described hereinbefore but also any pressure capable of causing a plasma to occur can be applied in carrying out the invention.

Further, with the sixth and seventh embodiments as described hereinbefore, the noble metal layer is formed on the surface of the wristwatch case and the ring, respectively, however, needless to say, the noble metal layer may be formed on the surface of the soft metal article 5 as described with reference to the first to third embodiments. In such a case, there may be provided a step of forming the noble metal layer on top of the hard layer 3 after a step of forming the hard layer 3 made of an amorphous alloy on the surface of the soft metal article 5.

INDUSTRIAL APPLICABILITY

The invention is able to provide soft metals, and decorative articles, having not only high impact resistance and insusceptibility to scratches, due to the high surface hardness thereof, but also excellent corrosion resistance so as not to cause corrosion to occur thereto and not to impair decorativeness thereof. Further, with the soft metals, and the decorative articles, since the film formed on the surface thereof has high adhesion property, corrosion of the surface due to peeling of the film does not occur. Furthermore, the soft metals and decorative articles, having high magnetic resistivity, can be obtained by forming a film composed of a magnetic element.

In particular, if a pre-polishing to a mirror polished condition is applied to the surface thereof, the mirror polished condition can be maintained even after the formation of the film, so that the decorative quality of a timepiece, ring, and so forth will not be impaired by the formation of the film. Further, as it is possible to provide decorative articles of wristwatch with magnetic resistivity by applying the invention thereto, the invention is able to provide decorative articles of wristwatch useful in commercial application.

What is claimed is:

1. A soft metal with a film formed thereon, the film containing phosphorus and either platinum or palladium, and further, at least one element having homogeneous solubility with platinum or palladium, with the content of the phosphorus being in a range of about 15 to 25 atomic %.

2. The soft metal according to claim 1, wherein one of elements having homogeneous solubility with platinum or palladium is nickel.

3. A soft metal characterized in that a film made of an amorphous alloy is formed on the surface thereof, wherein a film formed thereon is made of an alloy selected from the group consisting of a platinum-copper-nickel-phosphorus alloy, platinum-nickel-phosphorus alloy, palladium-copper-nickel-phosphorus alloy, palladium-nickel-phosphorus alloy, palladium-platinum-copper-nickel-phosphorus alloy, and palladium-platinum-nickel-phosphorus alloy.

4. A soft metal characterized in that a film made of an amorphous alloy is formed on the surface thereof, wherein a film formed thereon is made of a gold-germanium-silicon alloy or a palladium-copper-silicon alloy.

5. A soft metal characterized in that a film made of an amorphous alloy is formed on the surface thereof, wherein a noble metal layer is formed on the film of the amorphous alloy.

6. The soft metal according to claim 5, wherein the noble metal layer is made of platinum or palladium.

7. A soft metal with a film formed thereon, the film containing cobalt, and at least one element selected from the elements belonging to periodic table groups IVa, Va, or VIa, respectively, with the content of the cobalt being in a range of from about 55 to 95 atomic %, wherein a noble metal layer is formed on the film of the amorphous alloy.

8. The soft metal according to claim 7, wherein the noble metal layer is made of platinum or palladium.

9. A soft metal with a film formed thereon, the film containing cobalt, and at least one element selected from the elements belonging to periodic table groups IVa, Va, or VIa, respectively, with the content of the cobalt being in a range of from about 55 to 95 atomic %, wherein one element selected from the group consisting of the elements belonging to periodic table groups IVa, Va, or VIa, respectively, is any of zirconium, niobium, and tantalum, wherein a noble metal layer is formed on the film of the amorphous alloy.

10. A method of producing a soft metal comprising the steps of disposing a soft metal and a target made of a predetermined alloy in a vacuum apparatus, depositing atoms of metals composing the target on the surface of the soft metal, thereby forming a film made of an amorphous alloy composed of the atoms of the metals on the surface thereof, and forming a noble metal layer on top of the film made of the amorphous alloy after the step of forming the film made of the amorphous alloy on the surface of the soft metal.

11. A decorative article with a film formed thereon, the film made of an amorphous alloy, wherein a noble metal layer is formed on top of the film.

12. A decorative article with a film formed thereon, the film containing cobalt, and at least one element selected from the elements belonging to periodic table groups IVa, Va, or VIa, respectively, with the content of the cobalt being in a range of from about 55 to 95 atomic %, wherein a noble metal layer is formed on top of the film.

13. A decorative article with a film formed thereon, the film containing cobalt, and at least one element selected from the elements belonging to periodic table groups IVa, Va, or VIa, respectively, with the content of the cobalt being in a range of from about 55 to 95 atomic %, wherein one element selected from the elements belonging to periodic table groups IVa, Va, or VIa, respectively, is zirconium, niobium, or tantalum, wherein a noble metal layer is formed on top of the film.

14. A decorative article with a film formed thereon, the film made of an amorphous alloy, wherein a noble metal layer is formed on top of the film, and wherein the noble metal layer is made of platinum or palladium.

15. A decorative article with a film formed thereon, the film containing cobalt, and at least one element selected from the elements belonging to periodic table groups IVa, Va, or VIa, respectively, with the content of the cobalt being in a range of from about 55 to 95 atomic %, wherein a noble metal layer is formed on top of the film, and wherein the noble metal layer is made of platinum or palladium.

16. A method of producing a decorative article, comprising the steps of disposing a decorative article and a target made of a predetermined alloy in a vacuum apparatus, depositing atoms of metals composing the target on the surface of the decorative article, thereby forming a film made of an amorphous alloy composed of the atoms of the metals on the surface thereof, and the step of forming a noble metal layer on top of the film made of the amorphous alloy after the step of forming the film made of the amorphous alloy on the surface of the decorative article.

* * * * *